US012574038B2

(12) United States Patent
Hong et al.

(10) Patent No.: US 12,574,038 B2
(45) Date of Patent: Mar. 10, 2026

(54) ANALOG-TO-DIGITAL CONVERTER CIRCUIT, AN ELECTRONIC DEVICE INCLUDING THE SAME AND A METHOD FOR CONTROLLING THE SAME

(71) Applicant: SAMSUNG ELECTRONICS CO., LTD., Suwon-si (KR)

(72) Inventors: Jaemin Hong, Suwon-si (KR); Kyunghoon Lee, Suwon-si (KR); Youngjae Cho, Suwon-si (KR); Michael Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 21 days.

(21) Appl. No.: 18/817,310

(22) Filed: Aug. 28, 2024

(65) Prior Publication Data

US 2025/0192791 A1 Jun. 12, 2025

(51) Int. Cl.
H04L 7/00 (2006.01)
H03M 1/10 (2006.01)

(52) U.S. Cl.
CPC ........ H03M 1/1014 (2013.01); H04L 7/0033 (2013.01)

(58) Field of Classification Search
CPC ............. H03M 1/1014; H03M 1/1009; H03M 1/1052; H03M 1/0624; H03M 1/1215; H04L 7/0033; H04B 1/16
(Continued)

(56) References Cited

U.S. PATENT DOCUMENTS 8,659,461 B1 2/2014 Zhu et al.
8,836,553 B2 9/2014 Zhang et al.
(Continued)

FOREIGN PATENT DOCUMENTS

CN 115021754 A 9/2022
KR 10-2022-0142213 A 10/2022
KR 10-2022-0161851 A 12/2022

OTHER PUBLICATIONS

Behzad Razavi, "Design Considerations for Interleaved ADCs", in IEEE Journal of Solidstate Circuits, vol. 48, No. 8, pp. 1806-1817.
(Continued)

*Primary Examiner* — Phuong Phu
(74) *Attorney, Agent, or Firm* — Morgan, Lewis & Bockius LLP

(57) ABSTRACT

An ADC circuit including: ADCs to perform conversion operations in a time-interleaving manner; and a control logic circuit connected to the ADCs, wherein the control logic circuit is configured to: calculate a correlation value between data output from the ADCs a first number of times using a first number of bits among each bit of the data; calibrate a sampling timing of at least some of the ADCs, based on a first cumulative correlation value, which is obtained by accumulating correlation values calculated the first number of times; calculate the correlation value between the data a second number of times by using a second number of bits in each of the data; and calibrate the sampling timing of the at least some of the ADCs, based on a second cumulative correlation value, which is obtained by accumulating correlation values calculated the second number of times.

20 Claims, 16 Drawing Sheets

100

120

(58) Field of Classification Search

USPC ................................. 375/355, 354, 371, 373

See application file for complete search history.

(56) References Cited

U.S. PATENT DOCUMENTS

| | | | |
|---|---|---|---|
| 9,184,737 B1 | 11/2015 | Ali et al. | |
| 9,270,291 B1 | 2/2016 | Parnaby et al. | |
| 9,331,706 B1 | 5/2016 | Ranjbar | |
| 9,608,652 B2 | 3/2017 | Lee et al. | |
| 10,826,513 B1 | 11/2020 | Yang et al. | |
| 11,018,682 B1 * | 5/2021 | Gupta | H03M 1/1215 |
| 11,233,521 B2 | 1/2022 | Belostotski et al. | |
| 11,757,462 B2 | 9/2023 | Shin et al. | |
| 2012/0001783 A1 | 1/2012 | Eklund et al. | |
| 2012/0050079 A1 * | 3/2012 | Goldman | H03M 1/0624 |
| | | | 341/118 |
| 2013/0241755 A1 * | 9/2013 | Chen | H03M 1/1009 |
| | | | 341/120 |
| 2014/0002284 A1 * | 1/2014 | Tan | H03M 1/1052 |
| | | | 341/118 |
| 2022/0337260 A1 * | 10/2022 | Shin | H04B 1/16 |
| 2022/0385297 A1 | 12/2022 | Lee et al. | |
| 2023/0231565 A1 * | 7/2023 | Luo | H03M 1/1009 |
| | | | 341/120 |

OTHER PUBLICATIONS

Xiong Wei et al: "Fast convergent background calibration technique for timing mismatch in M-channel time-interleaved ADCs", AEU—International Journal of Electronics and Communications, Elsevier, Amsterdam, NL.

Extended European Search Report dated May 9, 2025 issued in corresponding European Patent Application No. 24218718.5.

* cited by examiner

【FIG. 1】
100
120
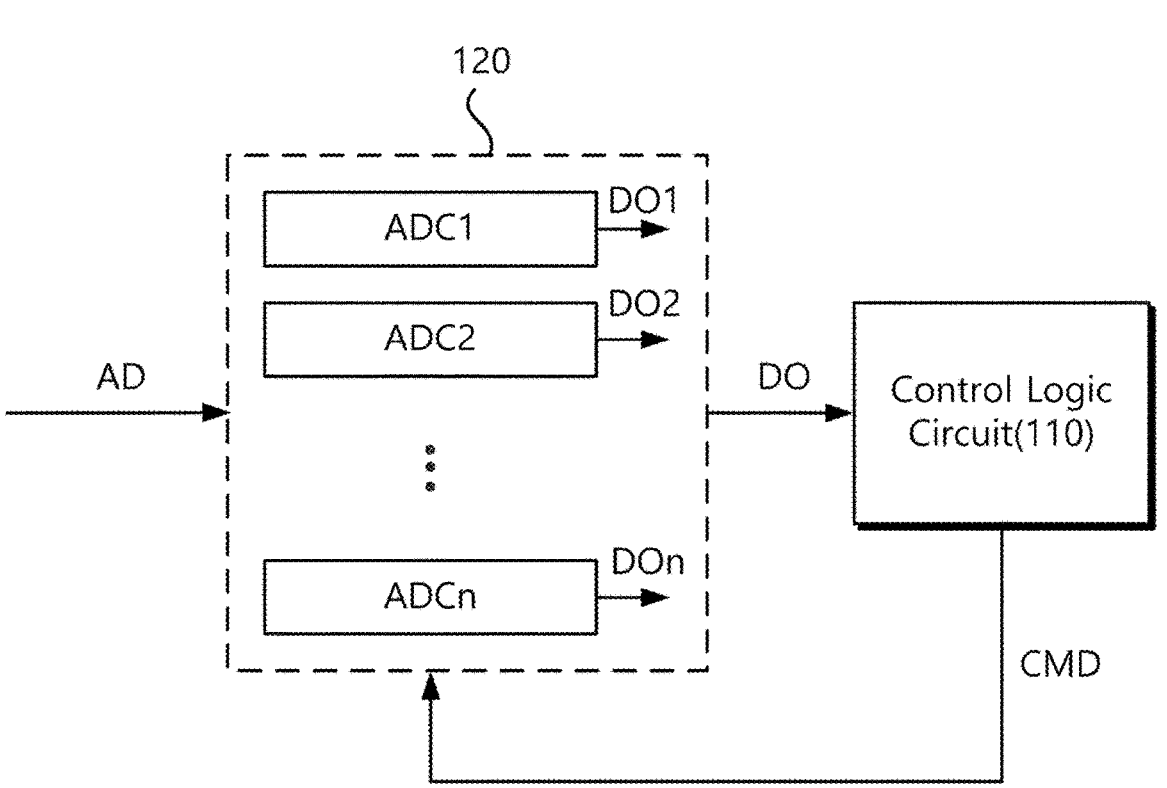
AD
ADC1 → DO1
ADC2 → DO2
ADCn → DOn
DO → Control Logic Circuit(110)
CMD 【FIG. 2A】
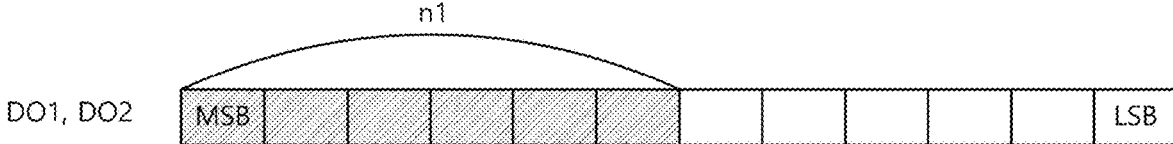
【FIG. 2B】
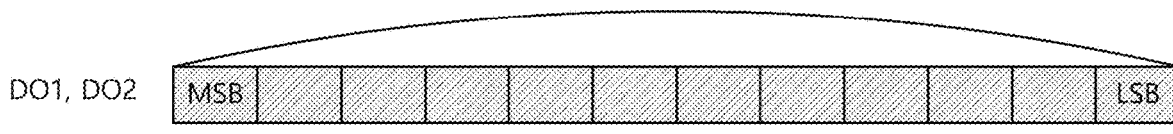

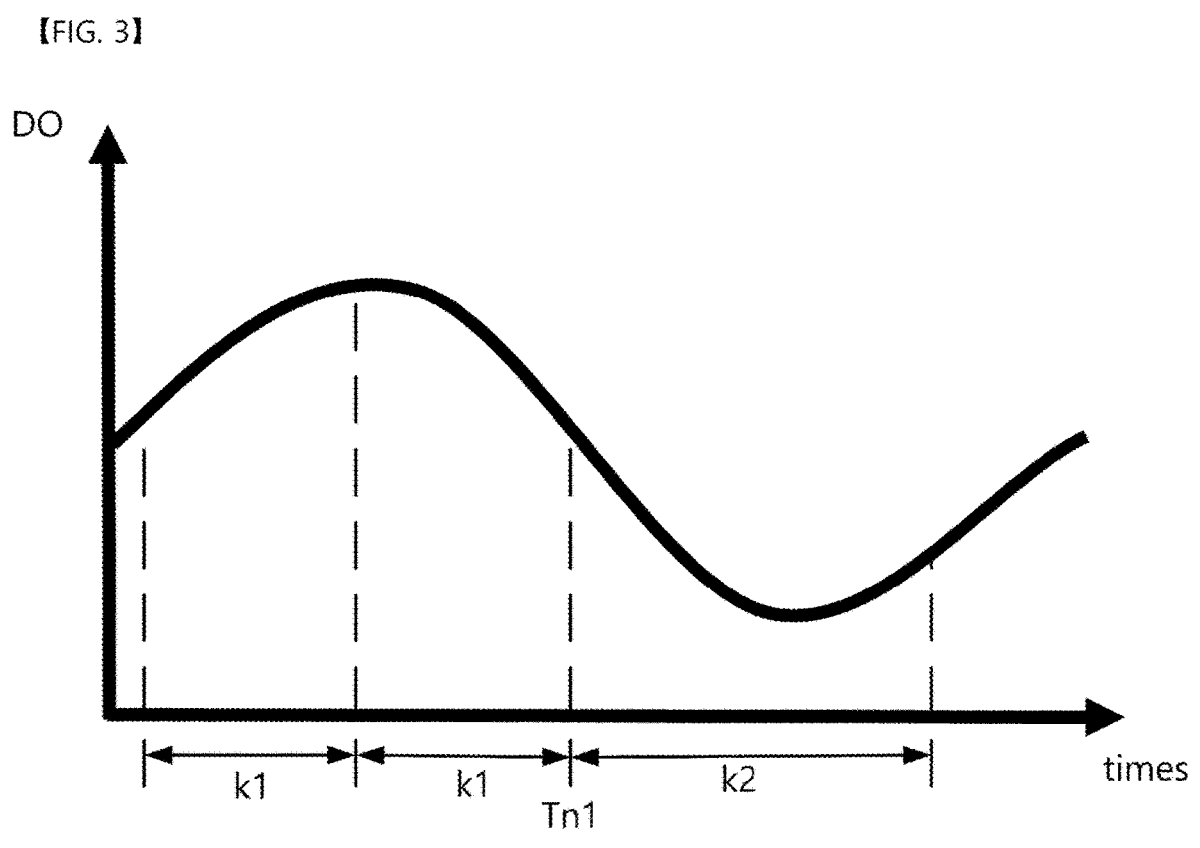

【FIG. 3】

【FIG. 4A】
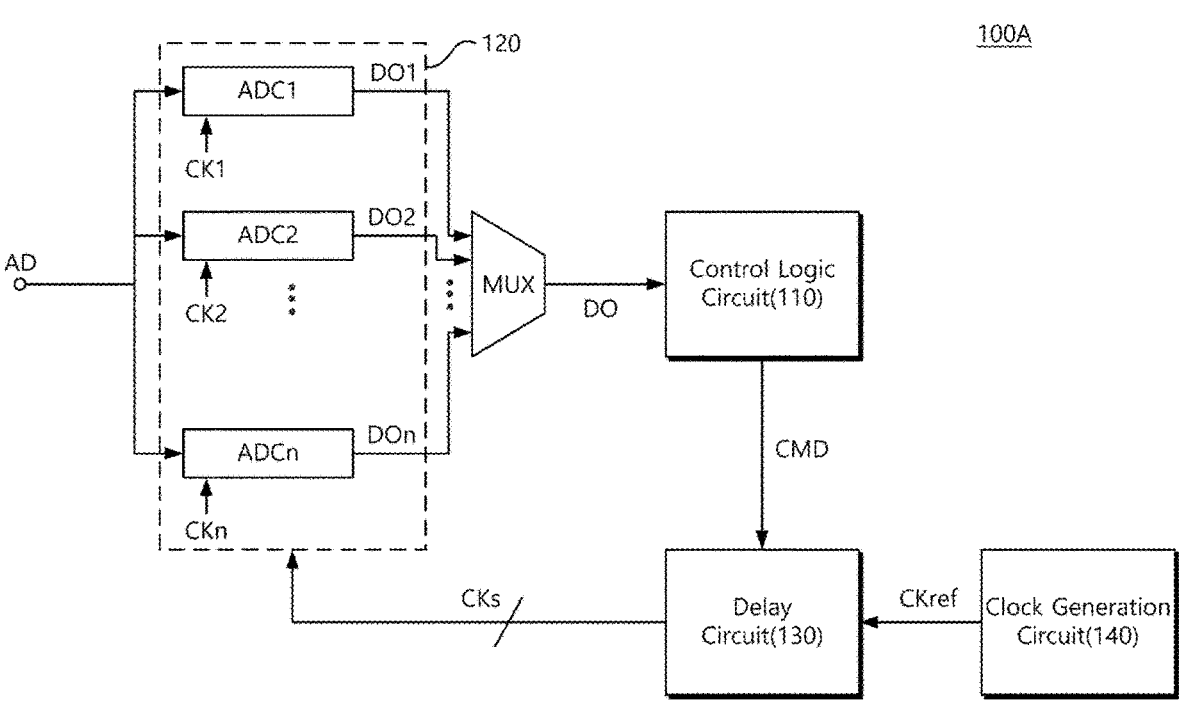

【FIG. 4B】
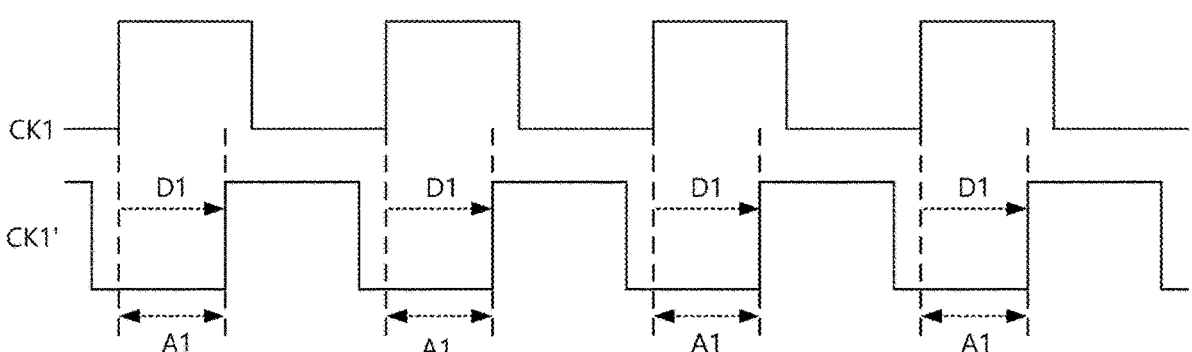

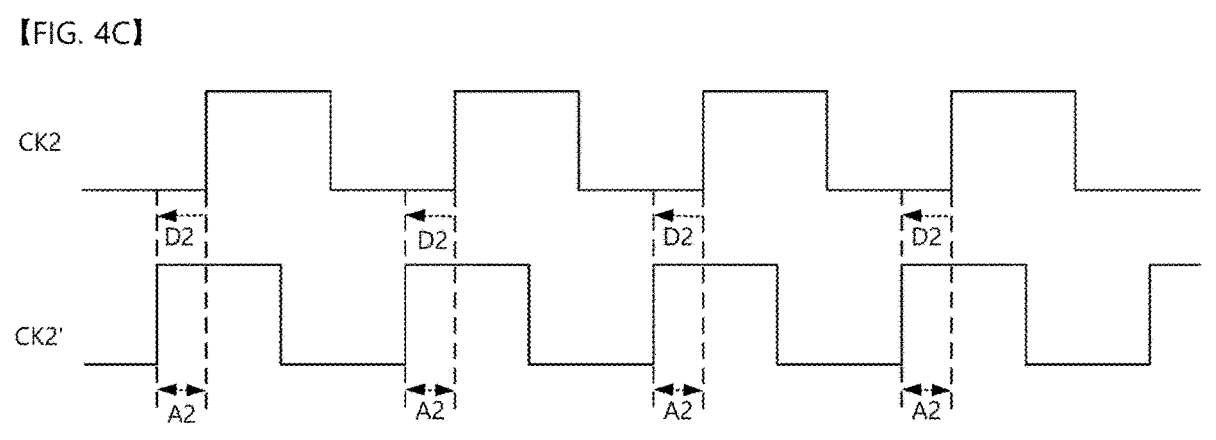

【FIG. 4C】

【FIG. 5】
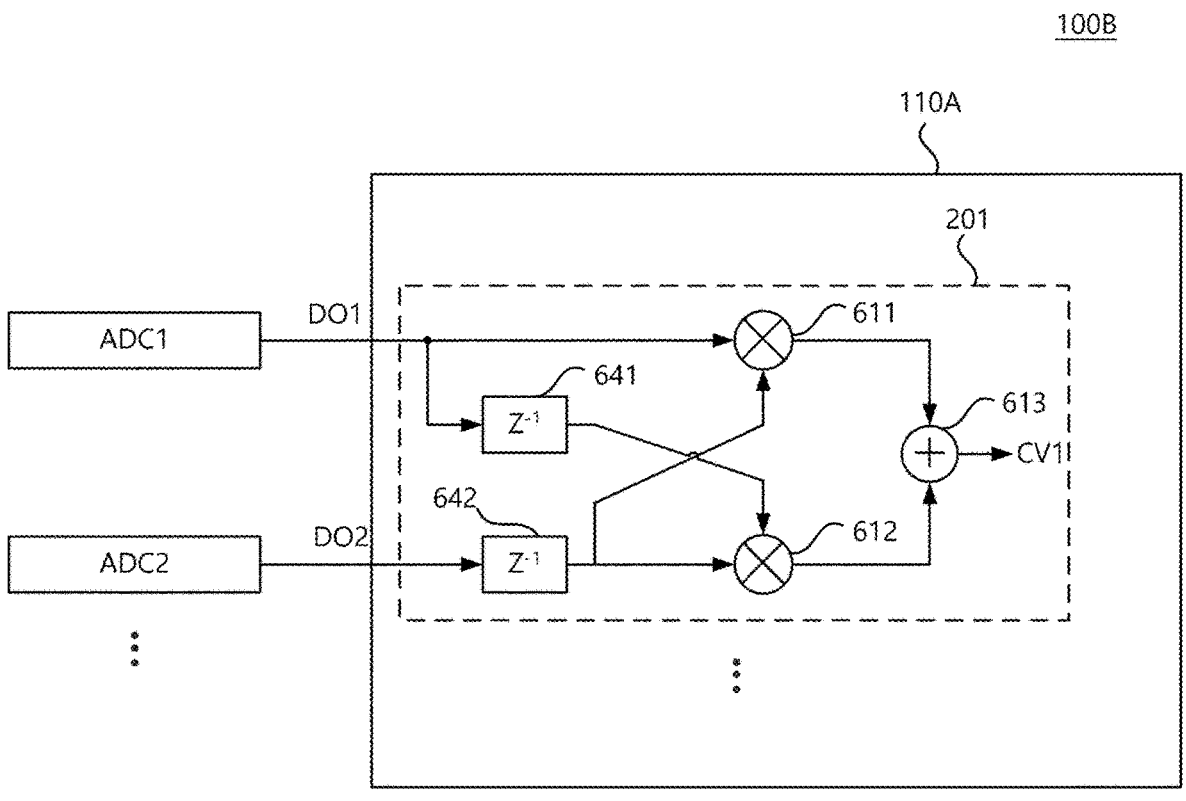

【FIG. 6】

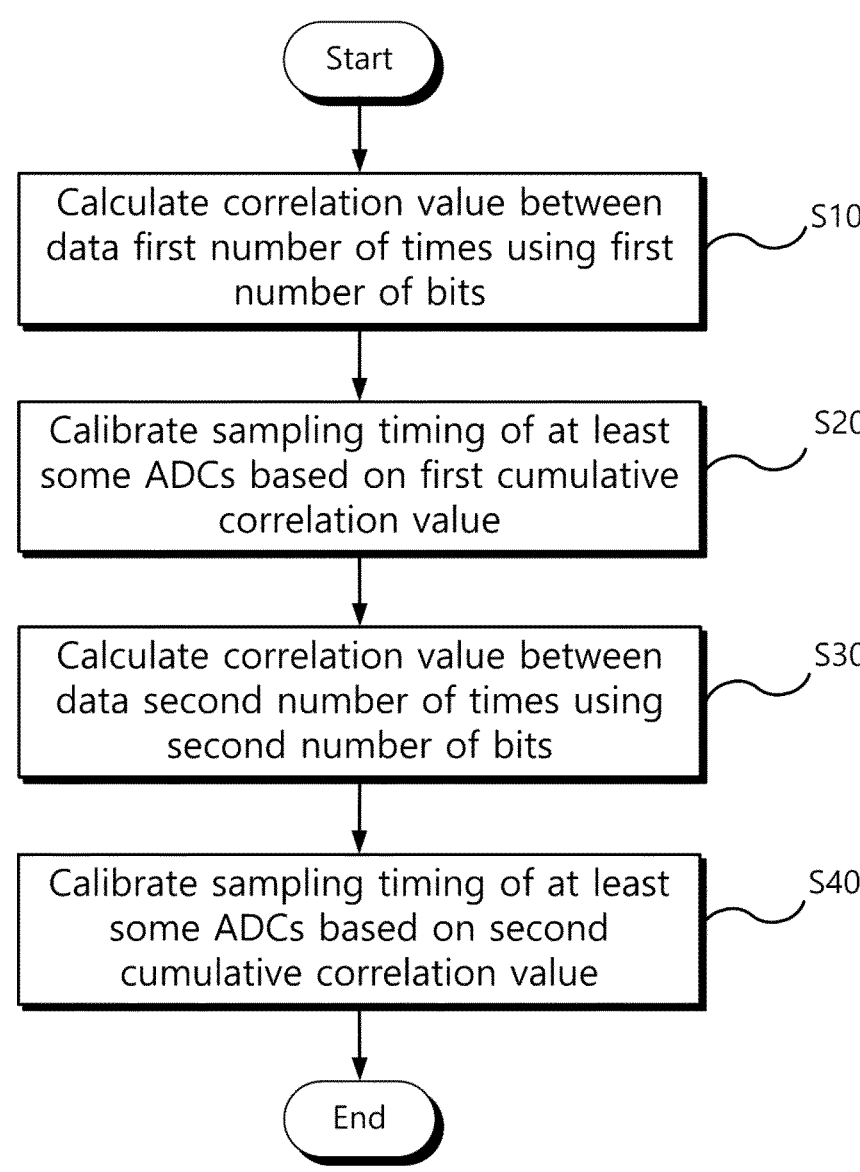

Start

Calculate correlation value between data first number of times using first number of bits — S10

Calibrate sampling timing of at least some ADCs based on first cumulative correlation value — S20

Calculate correlation value between data second number of times using second number of bits — S30

Calibrate sampling timing of at least some ADCs based on second cumulative correlation value — S40

End

【FIG. 7】
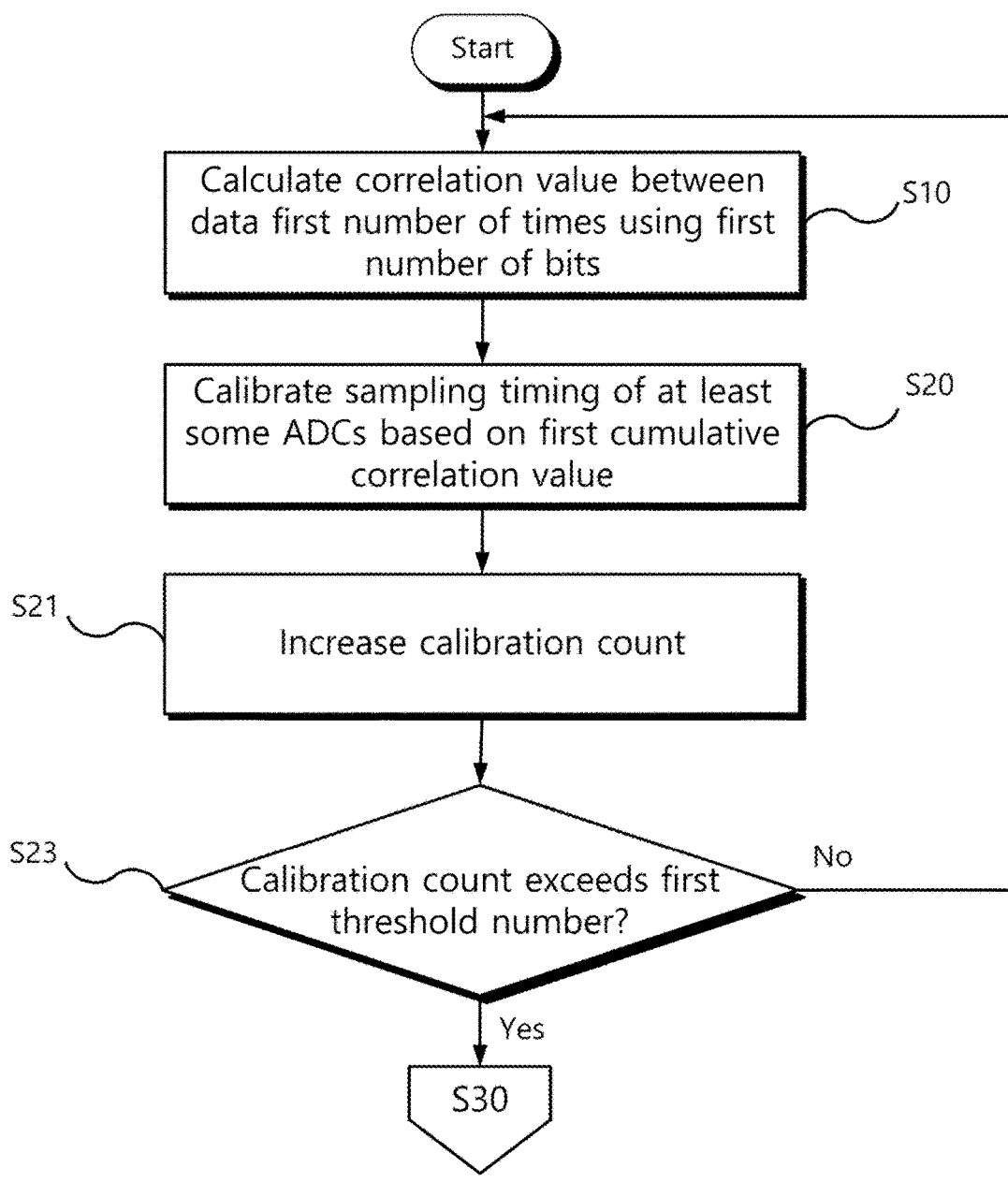

【FIG. 8A】
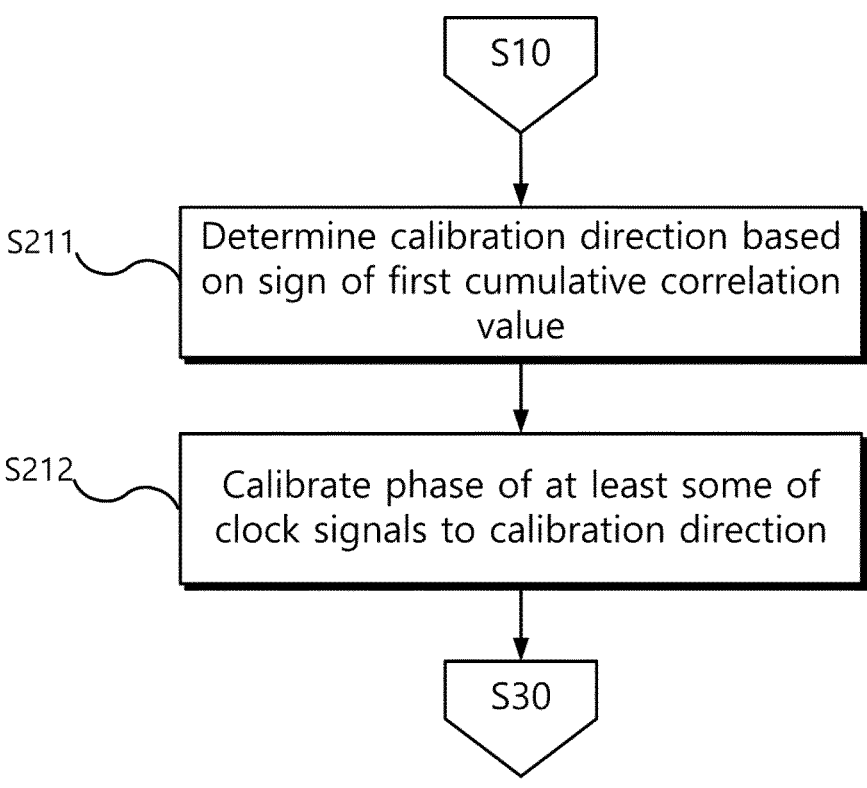

【FIG. 8B】
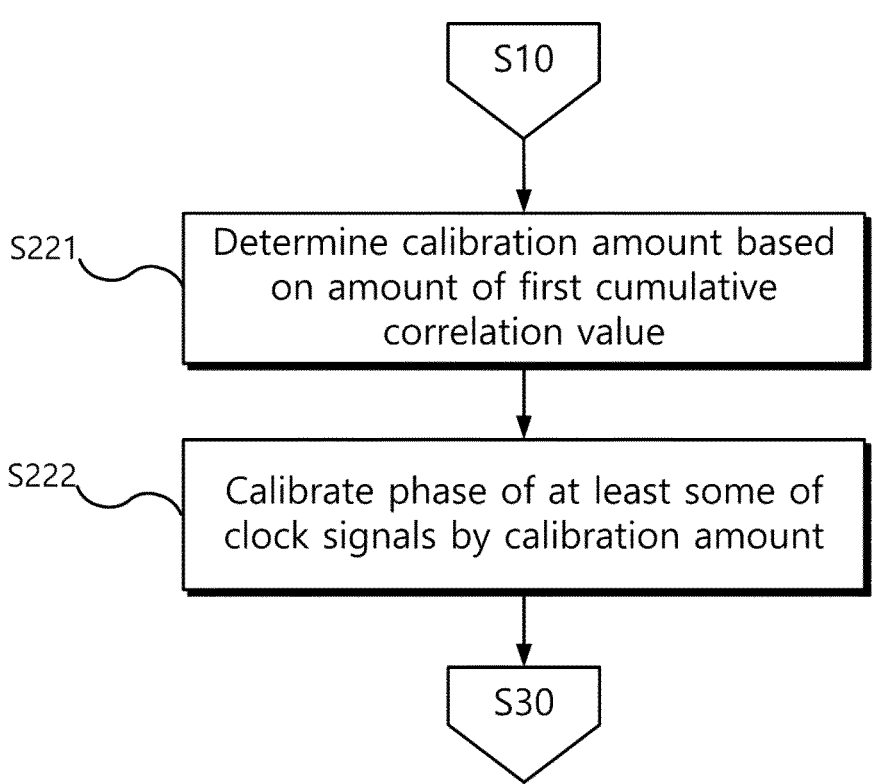

【FIG. 9】
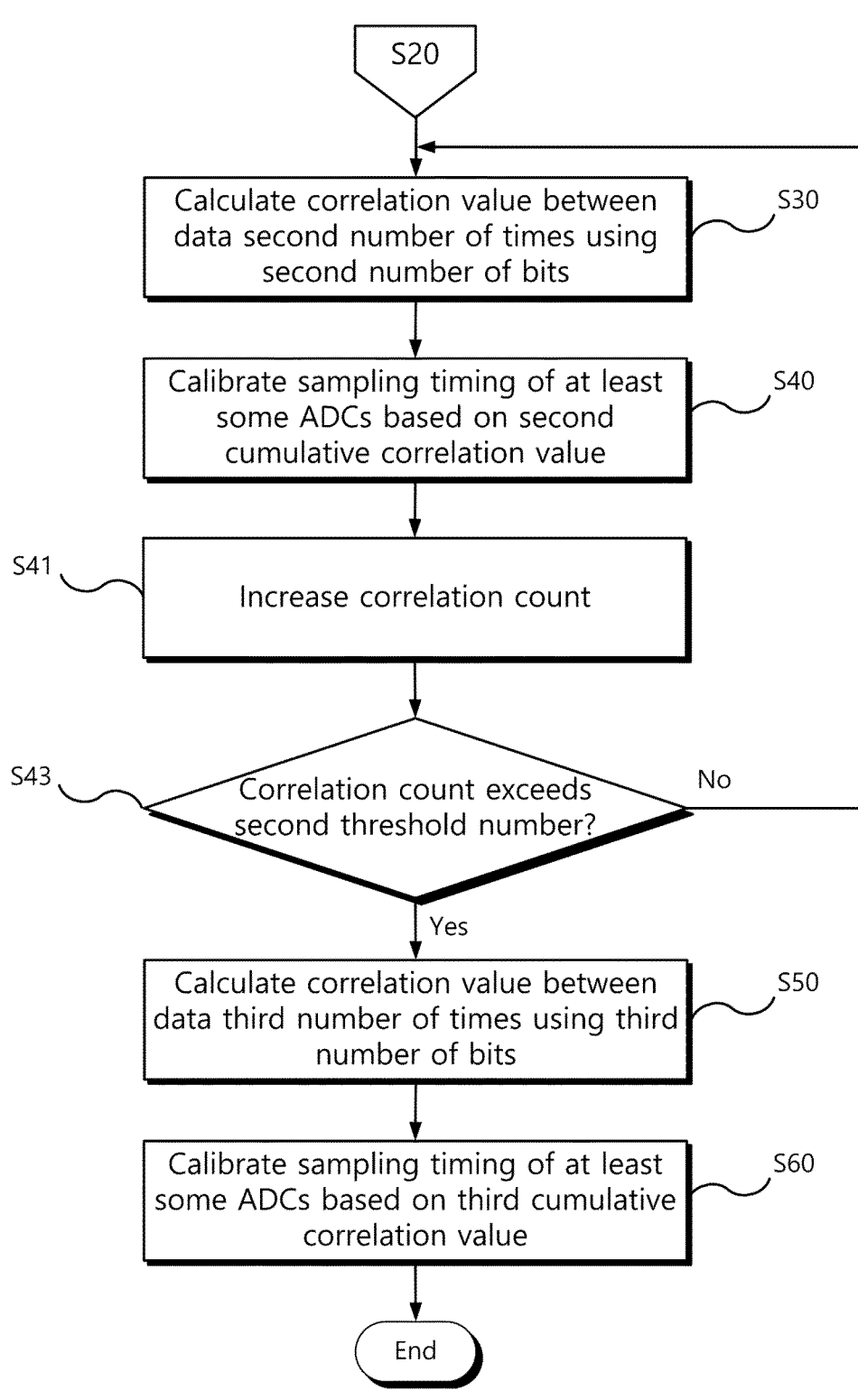

【FIG. 10A】
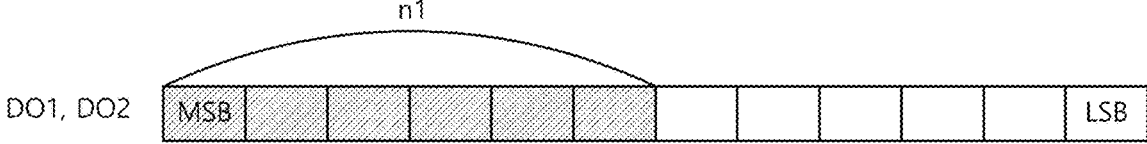
【FIG. 10B】
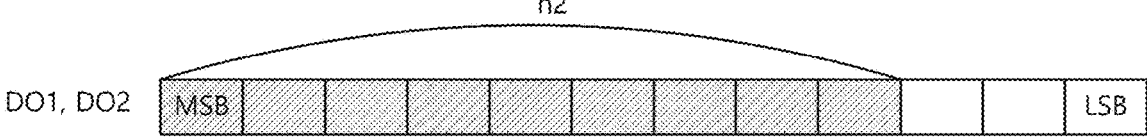
【FIG. 10C】
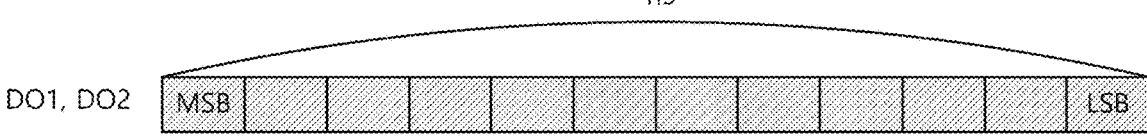

【FIG. 11】
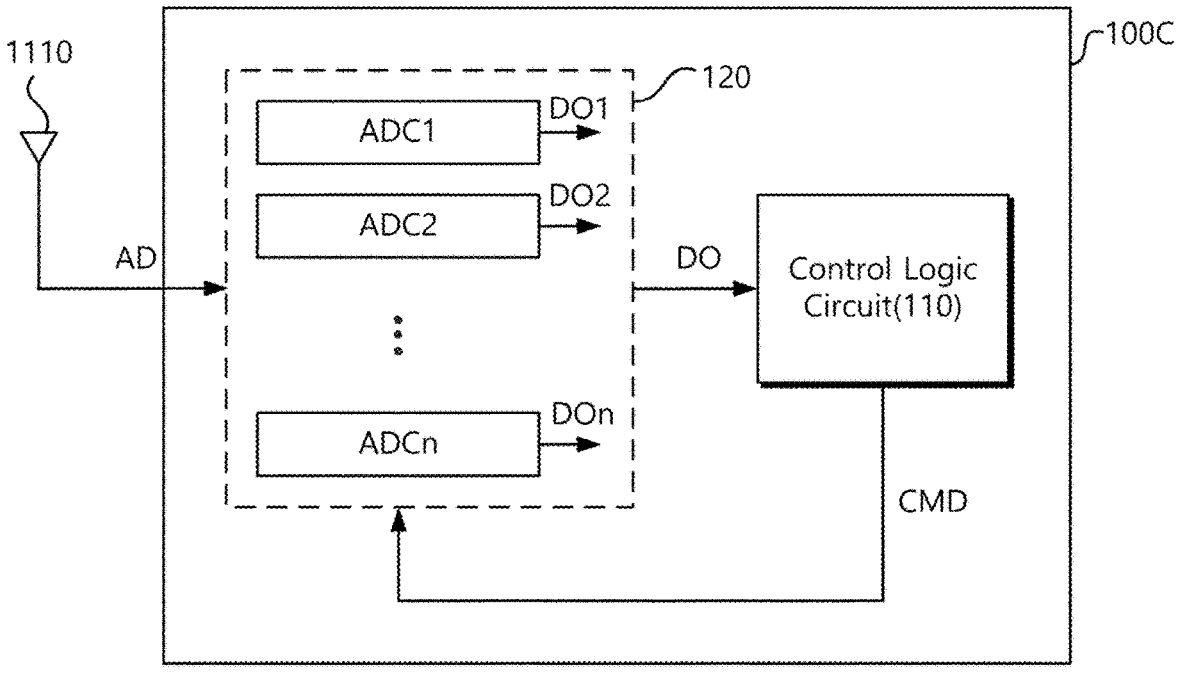

【FIG. 12】
1200
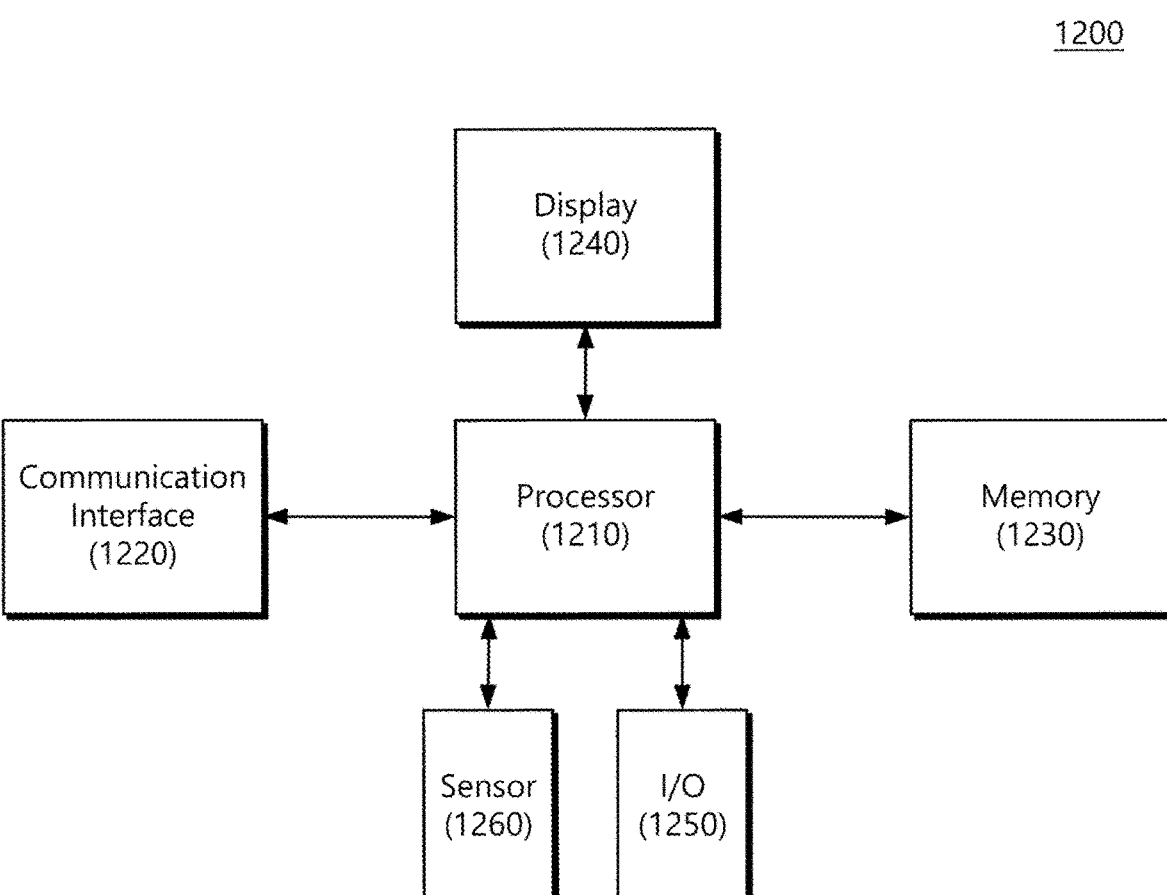

【FIG. 13】
1000
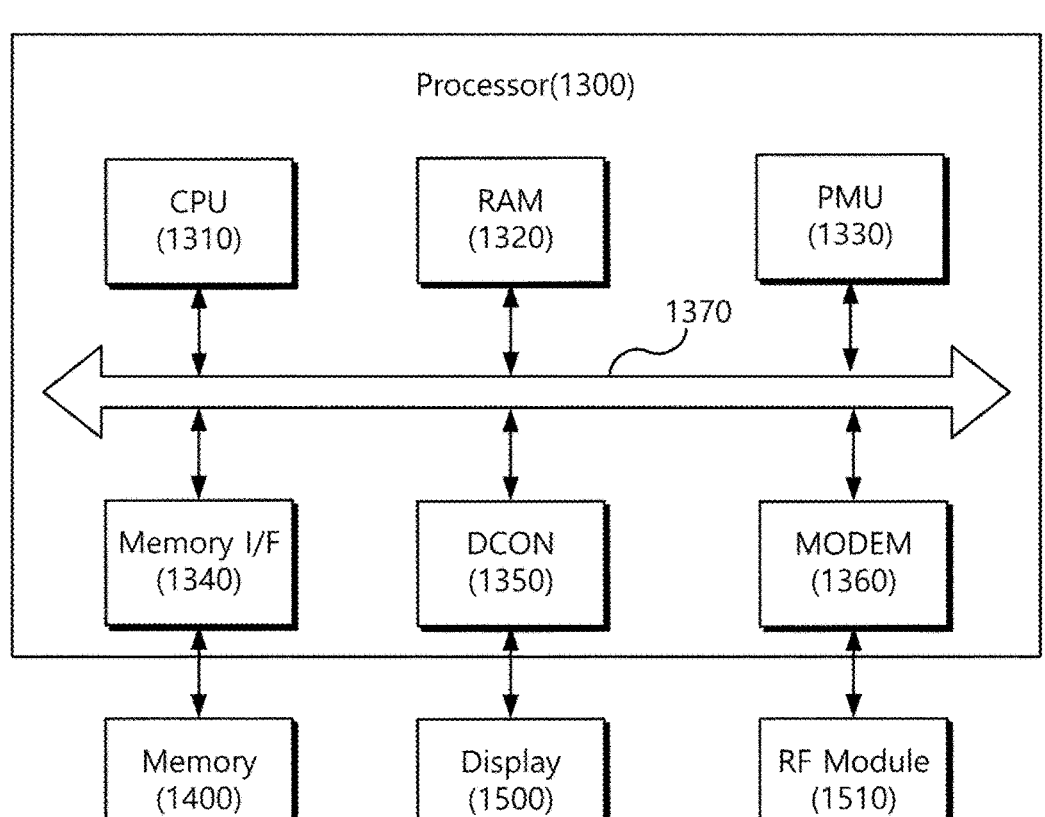

ANALOG-TO-DIGITAL CONVERTER CIRCUIT, AN ELECTRONIC DEVICE INCLUDING THE SAME AND A METHOD FOR CONTROLLING THE SAME

CROSS-REFERENCE TO RELATED APPLICATION

This application claims priority under 35 U.S.C. § 119 to Korean Patent Application No. 10-2023-0178954 filed on Dec. 11, 2023, in the Korean Intellectual Property Office, the disclosure of which is incorporated by reference herein in its entirety.

TECHNICAL FIELD

Embodiments of the present disclosure described herein relate to an analog-to-digital converter circuit, an electronic device including the same, and a method of controlling the same.

DISCUSSION OF RELATED ART

Analog signals can be converted into digital signals, making them easier to process with modern digital systems. For example, a radio frequency (RF) signal in analog form can be received via an antenna in an electronic device and converted into a digital signal for processing by the device's internal system.

The circuit that performs this conversion is called an analog-to-digital converter (ADC). The output of this ADC can be used to drive components within a digital system.

Recently, to enhance the speed of these ADC circuits, a high-speed analog-to-digital conversion method using multiple ADCs in a time-interleaving manner has been used.

However, this approach can lead to data distortion due to time skew errors between the multiple ADCs, potentially degrading the performance of the ADC circuits.

To address this issue, calibration methods have been developed to calibrate the sampling timing of the multiple ADCs using correlation calculations based on their respective outputs.

SUMMARY

Embodiments of the present disclosure provide an analog-to-digital converter (ADC) circuit that minimizes both power consumption and time required to calculate correlation values between data output from a plurality of ADCs, thereby enabling efficient calibration of their sampling timing.

According to an embodiment of the present disclosure, there is provided an ADC circuit, the ADC circuit including: a plurality of ADCs configured to perform conversion operations in a time-interleaving manner; and a control logic circuit connected to the plurality of ADCs, wherein the control logic circuit is configured to: calculate a correlation value between data output from the plurality of ADCs a first number of times using a first number of bits among each bit of the data; calibrate a sampling timing of at least some of the plurality of ADCs, based on a first cumulative correlation value, which is obtained by accumulating correlation values calculated the first number of times; calculate the correlation value between the data a second number of times by using a second number of bits in each of the data, wherein the second number of times is greater than the first number of times and the second number of bits is greater than the first number of bits; and calibrate the sampling timing of the at least some of the plurality of ADCs, based on a second cumulative correlation value, which is obtained by accumulating correlation values calculated the second number of times.

According to an embodiment of the present disclosure, there is provided a method of controlling of an ADC circuit, the method including: calculating a correlation value between data output from a plurality of ADCs a first number of times using a first number of bits in each of the data; calibrating a sampling timing of at least some of the plurality of ADCs, based on a first cumulative correlation value, which is obtained by accumulating correlation values calculated the first number of times; calculating the correlation value between the data a second number of times using a second number of bits in the each of the data, wherein the second number of time is greater than the first number of times and the second number of bits is greater than the first number of bits; and calibrating the sampling timing of the at least some of the plurality of ADCs, based on a second cumulative correlation value, which is obtained by accumulating correlation values calculated the second number of times.

According to an embodiment of the present disclosure, there is provided an electronic device which transmits and receives a radio frequency (RF) signal, the electronic device including: an antenna configured to receive the RF signal; and an ADC circuit configured to convert the RF signal into a digital signal, wherein the ADC circuit includes: a first ADC and a second ADC which perform conversion operations in a time-interleaving manner, and a control logic circuit connected to the first ADC and the second ADC, wherein the control logic circuit is configured to: calculate a correlation value between first data output from the first ADC and second data output from the second ADC using a first number of bits in each of the first data and the second data; calibrate a sampling timing of at least some of the first ADC and the second ADC, based on a first cumulative correlation value that includes the calculated correlation value; calculate a correlation value between the first data and the second data using a second number of bits greater than the first number of bits in each of the first data and the second data; and calibrate the sampling timing of the at least some of the first ADC and the second ADC, based on a second cumulative correlation value that includes the calculated correlation value.

BRIEF DESCRIPTION OF THE DRAWINGS

The above and other features of the present disclosure will become apparent by describing in detail embodiments thereof with reference to the accompanying drawings.

FIG. 1 is a block diagram illustrating an analog-to-digital converter (ADC) circuit, according to an embodiment.

FIG. 2A is a diagram illustrating a first number of bits used by a control logic circuit according to an embodiment to calculate a correlation value between data output from ADCs.

FIG. 2B is a diagram illustrating a second number of bits used by a control logic circuit according to an embodiment to calculate a correlation value between data output from ADCs.

FIG. 3 is a diagram illustrating a configuration in which a control logic circuit calculates a correlation value between data output from ADCs a different number of times, according to an embodiment.

FIG. 4A is a block diagram illustrating a configuration of an ADC circuit further including a clock generation circuit and a delay circuit, according to an embodiment.

FIG. 4B is a diagram illustrating a configuration in which a control logic circuit controls phases of first clock signals through a delay circuit, according to an embodiment.

FIG. 4C is a diagram illustrating a configuration in which a control logic circuit controls a phase of a second clock signal through a delay circuit, according to an embodiment.

FIG. 5 is a block diagram illustrating an ADC circuit including a control logic circuit including a correlation circuit, according to an embodiment.

FIG. 6 is a flowchart illustrating a method in which a control logic circuit calibrates a phase of at least some of a plurality of ADCs, according to an embodiment.

FIG. 7 is a flowchart illustrating a method in which a control logic circuit according to an embodiment calculates a correlation value between data output from a plurality of ADCs a different number of times using different numbers of bits depending on the number of calibrations.

FIG. 8A is a flowchart illustrating a method in which a control logic circuit according to an embodiment controls a phase of a clock signal in a calibration direction based on a sign of a first cumulative correlation value.

FIG. 8B is a flowchart illustrating a method in which a control logic circuit according to an embodiment controls a phase of a clock signal by a calibration amount based on an amount of a first cumulative correlation value.

FIG. 9 is a flowchart illustrating a method in which a control logic circuit according to an embodiment calibrates a sampling timing of at least some of a plurality of ADCs based on a third cumulative correlation value.

FIG. 10A is a diagram illustrating a first number of bits used by a control logic circuit according to an embodiment to calculate a correlation value between data output from ADCs.

FIG. 10B is a diagram illustrating a second number of bits used by a control logic circuit according to an embodiment to calculate a correlation value between data output from ADCs.

FIG. 10C is a diagram illustrating a third number of bits used by a control logic circuit according to an embodiment to calculate a correlation value between data output from ADCs.

FIG. 11 is a block diagram illustrating an electronic device including an antenna and an ADC circuit, according to an embodiment.

FIG. 12 is a block diagram illustrating an Internet of Things (IoT) device including an ADC circuit, according to an embodiment.

FIG. 13 is a block diagram illustrating a mobile terminal to which an ADC circuit is applied, according to an embodiment.

DETAILED DESCRIPTION OF THE EMBODIMENTS

Hereinafter, embodiments of the present disclosure will be described with reference to the accompanying drawings.

FIG. 1 is a block diagram illustrating an analog-to-digital converter (ADC) circuit, according to an embodiment. FIG. 2A is a diagram illustrating a first number of bits used by a control logic circuit according to an embodiment to calculate a correlation value between data output from ADCs. FIG. 2B is a diagram illustrating a second number of bits used by a control logic circuit according to an embodiment to calculate a correlation value between data output from ADCs. FIG. 3 is a diagram illustrating a configuration in which a control logic circuit according to an embodiment calculates a correlation value between data output from ADCs a different number of times.

Referring to FIG. 1, an ADC circuit 100 according to an embodiment may include a plurality of ADCs 120 and a control logic circuit 110.

For example, the ADC circuit 100 may include the plurality of ADCs 120 that convert analog data AD into digital data DO to be output. The plurality of ADCs 120 may include a first ADC ADC1 to an n-th ADC ADCn, which are connected in parallel with each other.

According to an embodiment, the plurality of ADCs 120 may operate in a time-interleaving manner to convert the analog data AD into the digital data DO for output.

In more detail, each of the plurality of ADCs 120 may sample the analog data AD received from the outside based on clock signals having different phases. In other words, each of the plurality of ADCs 120 may sample the analog data AD received externally based on clock signals with different phases. Furthermore, each of the plurality of ADCs 120 may output data DO1 to DOn including sampled data samples.

The digital data DO may include the data DO1 to DOn output from each of the plurality of ADCs 120. For example, the digital data DO may include data DO1 to DOn sequentially output from the plurality of ADCs 120.

Accordingly, the plurality of ADCs 120 may be referred to as a time-interleaved (TI) ADC. In addition, each of the plurality of ADCs 120 (e.g., ADC1 to ADCn) may be referred to as a sub-ADC.

In addition, the ADC circuit 100 may include the control logic circuit 110 connected to the plurality of ADCs 120.

The control logic circuit 110, for example, may execute software (or a program) to control at least one other component of the ADC circuit 100 (e.g., the plurality of ADCs 120), and may process or calculate various data. The control logic circuit 110 may include a central processing unit or microprocessor, and may control the overall operation of the ADC circuit 100. Accordingly, operations performed by the ADC circuit 100 may be performed under the control of the control logic circuit 110.

According to an embodiment, the control logic circuit 110 may include an algorithm for controlling the plurality of ADCs 120. For example, the algorithm may be software code programmed inside the control logic circuit 110. As another example, the algorithm may be hard codes obtained by hard coding inside the control logic circuit 110, but is not limited thereto.

The control logic circuit 110 may control a sampling timing of each of the plurality of ADCs 120 according to an algorithm. In more detail, the control logic circuit 110 may output a control signal CMD for controlling the sampling timing of each of the plurality of ADCs 120. The control signal CMD may be provided to the plurality of ADCs 120.

According to an embodiment, the control logic circuit 110 may calibrate the sampling timing of at least some of the plurality of ADCs 120 based on the digital data DO output from the plurality of ADCs 120.

In more detail, the control logic circuit 110 may calculate a correlation value between the data DO1 to DOn output from the plurality of ADCs 120 based on the digital data DO output from the plurality of ADCs 120.

For example, the control logic circuit 110 may calculate the correlation value between the data DO1 to DOn by inputting at least some of the bits of each of the data DO1 to DOn into a correlation function. In this case, the correlation value may be referred to as a correlation coefficient, indicating the degree to which each of the data DO1 to DOn is related.

Furthermore, the control logic circuit 110 may calibrate the sampling timing of at least some of the plurality of ADCs 120 based on the calculated correlation value.

In addition, the control logic circuit 110 according to an embodiment may increase a calibration count in response to calibrating the sampling timing of at least some of the plurality of ADCs 120.

For example, the control logic circuit 110 may increase the calibration count by "1" in response to calibrating the sampling timing of at least some of the plurality of ADCs 120.

In this case, the calibration count may refer to the number of times the control logic circuit 110 calibrates the sampling timing of at least some of the plurality of ADCs 120.

Referring to FIGS. 1, 2A, and 2B together, the control logic circuit 110 may calculate the correlation value between the data DO1 to DOn using at least some bits from each of the data DO1 to DOn output from the plurality of ADCs 120.

For example, the control logic circuit 110 may calculate the correlation value between the data DO1 to DOn using different numbers of bits in each of the data DO1 to DOn, depending on the number of calibrations performed on the sampling timing of the plurality of ADCs 120.

According to an embodiment, when the calibration count is less than or equal to a threshold number, the control logic circuit 110 may calculate the correlation value between the data DO1 to DOn using a first number n1 of bits from each of the data DO1 to DOn.

For example, referring to FIG. 2A, the control logic circuit 110 may calculate the correlation value between the first data DO1 output from the first ADC AC1 and the second data DO2 output from the second ADC2 using the first number n1 of bits from each of the first data DO1 and the second data DO2.

In this case, the control logic circuit 110 may calculate the correlation value between the data DO1 to DOn using the first number n1 of bits from a most significant bit (MSB) of each the first data DO1 and the second data DO2.

In detail, when the number of calibrations for the sampling timing of the plurality of ADCs 120 is less than or equal to a threshold number, the control logic circuit 110 may calculate the correlation value between the data DO1 to DOn using the first number n1 of bits including the most significant bit (MSB) in each of the data DO1 to DOn.

In addition, referring to FIGS. 2A and 3 together, when the calibration count is less than or equal to a threshold number Tn1, the control logic circuit 110 may calculate the correlation value between the data DO1 to DOn a first number of times k1.

In more detail, when the calibration count is less than or equal to the threshold number Tn1, the control logic circuit 110 may calculate the correlation value between the data DO1 to DOn by accumulating it the first number of times k1 using the first number n1 of bits in each of the data DO1 to DOn.

For example, when the calibration count is less than or equal to the threshold number Tn1, the control logic circuit 110 may calculate the correlation value between the first data DO1 and the second data DO2 the first number of times k1 using the first number n1 of bits in each of the first data DO1 and the second data DO2. In another example, when the calibration count is less than or equal to the threshold number Tn1, the control logic circuit 110 may calculate the correlation value between the second data DO2 and third data DO3 the first number of times k1 using the first number n1 of bits in each of the second data DO2 and the third data DO3.

For example, when the calibration count is less than or equal to the threshold number Tn1, the section in which the control logic circuit 110 calculates the correlation value between the data DO1 to DOn the first number of times k1 using the first number n1 of bits in each of the data DO1 to DOn may be referred to as a coarse calibration section.

Furthermore, the control logic circuit 110 may calibrate the sampling timing of at least some of the plurality of ADCs 120 based on a first cumulative correlation, where correlation values calculated the first number of times k1 are accumulated.

According to an embodiment, when the calibration count exceeds the threshold number Tn1, the control logic circuit 110 may calculate the correlation value between the data DO1 to DOn using a second number n2 of bits in each of the data DO1 to DOn.

For example, referring to FIG. 2B, the control logic circuit 110 may calculate the correlation value between the first data DO1 and the second data DO2 using the second number n2 of bits from each of the first data DO1 and the second data DO2.

In this case, the second number n2 may be larger than the first number n1.

Accordingly, when the calibration count exceeds the threshold number TN1, the control logic circuit 110 may calculate the correlation value between the data DO1 to DOn using the second number n2 of bits greater than the first number n1 of bits in each of the data DO1 to DOn.

In addition, for example, each of the data DO1 to DOn output from the plurality of ADCs 120 may be output with the second number n2 of bits.

Accordingly, when the number of calibrations for the sampling timing of the plurality of ADCs 120 exceeds the threshold number Tn1, the control logic circuit 110 may calculate the correlation value between the data DO1 to DOn using all bits of each of the data DO1 to DOn.

In detail, when the calibration count exceeds the threshold number Tn1, the control logic circuit 110 may calculate the correlation value between the data DO1 to DOn using the second number n2 of bits including the significant bit (MSB) to a least significant bit (LSB) in each of the data DO1 to DOn.

In addition, referring to FIGS. 2B and 3 together, when the calibration count exceeds the threshold number Tn1, the control logic circuit 110 may calculate the correlation value between the data DO1 to DOn a second number of times k2.

In this case, the second number of times k2 may be greater than the first number of times k1.

In more detail, when the calibration count exceeds the threshold number Tn1, the control logic circuit 110 may calculate the correlation value between the data DO1 to DOn by accumulating it the second number of times k2 using the second number n2 of bits in each of the data DO1 to DOn.

For example, the control logic circuit 110 may calculate the correlation value between the first data DO1 and the second data DO2 the second number of times k2 using the second number n2 of bits in each of the first data DO1 and the second data DO2. As another example, the control logic circuit 110 may calculate the correlation value between the second data DO2 and third data DO3 the second number of times k2 using the second number n2 of bits in each of the second data DO2 and the third data DO3.

For example, when the calibration count exceeds the threshold number Tn1, the section in which the control logic circuit 110 calculates the correlation value between the data DO1 to DOn the second number of times k2 using the second number n2 of bits in each of the data DO1 to DOn may be referred to as a fine calibration section.

Furthermore, the control logic circuit 110 may calibrate the sampling timing of at least some of the plurality of ADCs 120 based on a second cumulative correlation, where correlation values calculated the second number of times k2 are accumulated.

Referring to the above-described configuration, when the calibration count is less than or equal to the threshold number Tn1, the control logic circuit 110 may calculate the correlation value between the data DO1 to DOn using a relatively small number of bits in each of the data DO1 to DOn compared to the case where the calibration count exceeds the threshold number Tn1.

This way, the ADC circuit 100 according to an embodiment of the present disclosure may minimize power while calculating the correlation value between the data DO1 to DOn, to calibrate the sampling timing of at least some of the plurality of ADCs 120.

In addition, when the calibration count is less than or equal to the threshold number Tn1, the control logic circuit 110 may calculate the correlation value between the data DO1 to DOn by accumulating it a relatively small number of times compared to when the calibration count exceeds the threshold number Tn1.

Accordingly, the control logic circuit 110 may calculate the correlation value between the data DO1 to DOn at a relatively faster rate when the calibration count is less than or equal to the threshold number Tn1, compared to when the calibration count exceeds the threshold number Tn1.

This way, the ADC circuit 100 according to an embodiment of the present disclosure may minimize the time and/or power required in calculating the correlation value between the data DO1 to DOn, to calibrate the sampling timing of at least some of the plurality of ADCs 120.

In contrast, when the calibration count exceeds the threshold number Tn1, the control logic circuit 110 may increase the number of bits used to calculate the correlation value between the data DO1 to DOn.

In addition, when the calibration count exceeds the threshold number Tn1, the control logic circuit 110 may increase the number of calculations performed by accumulating the correlation values between the data DO1 to DOn.

Furthermore, the control logic circuit 110 may calibrate the sampling timing of at least some of the plurality of ADCs 120 based on the cumulative correlation value, where correlation values calculated an increased number of times are accumulated using an increased number of bits.

This way, the ADC circuit 100 according to an embodiment of the present disclosure may improve the accuracy of calibration for the sampling timing of the plurality of ADCs 120.

In detail, the control logic circuit 110 may calculate the correlation value between the data DO1 to DOn using different numbers of bits, depending on the number of calibrations performed for the sampling timing of at least some of the plurality of ADCs 120.

In addition, the control logic circuit 110 may calculate the correlation value between the data DO1 to DOn by accumulating it a different number of times based on the number of calibrations performed for the sampling timing of at least some of the plurality of ADCs 120.

This way, the ADC circuit 100 may minimize the time and power required to calculate the correlation value for calibrating the sampling timing of the plurality of ADCs 120 while maintaining calibration accuracy.

FIG. 4A is a block diagram illustrating a configuration of an ADC circuit further including a clock generation circuit and a delay circuit, according to an embodiment. FIG. 4B is a diagram illustrating a configuration in which a control logic circuit controls phases of first clock signals through a delay circuit, according to an embodiment. FIG. 4C is a diagram illustrating a configuration in which a control logic circuit controls a phase of a second clock signal through a delay circuit, according to an embodiment.

Referring to FIG. 4A, an ADC circuit 100A according to an embodiment may include the plurality of ADCs 120, the control logic circuit 110, a clock generation circuit 140, and a delay circuit 130.

The ADC circuit 100A illustrated in FIG. 4A is an example of the ADC circuit 100 illustrated in FIG. 1. Accordingly, for components that are the same as or similar to the above-described components, the same reference numerals are used, and descriptions that overlap with the above-described content are omitted to avoid redundancy.

According to an embodiment, the ADC circuit 100A may include the clock generation circuit 140 that generates a reference clock signal CKref.

The clock generation circuit 140 may generate the reference clock signal CKref with a preset target frequency based on the frequency and phase of an input signal.

For example, the clock generation circuit 140 may be a phase locked loop (PLL) circuit, which includes a phase detector, an oscillator, and a loop filter to generate the reference clock signal CKref with a specific target frequency.

As another example, the clock generation circuit 140 may be a delay locked loop (DLL) circuit that delays an input voltage signal by a preset phase and generates the reference clock signal CKref with the specific target frequency.

However, the configuration of the clock generation circuit 140 are not limited to the examples described above.

In addition, the ADC circuit 100A may include the delay circuit 130 that controls the phase of the reference clock signal CKref and outputs a plurality of clock signals CKs having different phases.

According to an embodiment, the delay circuit 130 may delay the phase of the reference clock signal CKref, received from the clock generation circuit 140, to varying degrees, providing the plurality of clock signals CKs with different phases to the plurality of ADCs 120.

For example, the delay circuit 130 may include a plurality of delay cells for controlling the phase of the reference clock signal CKref. Accordingly, the delay circuit 130 may control the phase of the reference clock signal CKref with the plurality of delay cells based on the control signal CMD received from the control logic circuit 110.

In addition, the ADC circuit 100A may include a multiplexer MUX connected to the plurality of ADCs 120.

According to an embodiment, the multiplexer MUX may output the digital data DO including some of the data DO1 to DOn output from the plurality of ADCs 120.

The multiplexer MUX may sequentially output the data DO1 to DOn output from the plurality of ADCs 120. Accordingly, the digital data DO output through the multiplexer MUX may include the data DO1 to DOn, which are output in sequence from the plurality of ADCs 120.

According to an embodiment, the control logic circuit 110 may calculate the correlation value between the data DO1 to DOn included in the digital data DO.

In more detail, the control logic circuit 110 may calculate the correlation value between the data DO1 to DOn using at least some of the bits of each of the data DO1 to DOn.

In addition, the control logic circuit 110 may use at least some of the bits of each of the data DO1 to DOn to calculate the correlation value between the data DO1 to DOn by accumulating it a specific number of times.

Furthermore, the control logic circuit 110 may calibrate the phase of at least some of the plurality of clock signals CKs output through the delay circuit 130 based on the cumulative correlation value calculated by accumulating it a specific number of times.

According to an embodiment, when the number of calibrations with respect to the phase of at least some of the plurality of clock signals CKs is less than or equal to the threshold number Tn1, the control logic circuit 110 may calculate the correlation value between the data DO1 to DOn using the first number n1 of bits from each of the data DO1 to DOn.

In addition, when the number of calibrations with respect to the phase of at least some of the plurality of clock signals CKs is less than or equal to the threshold number Tn1, the control logic circuit 110 may calculate the correlation value between the data DO1 to DOn the first number of times k1.

According to another embodiment, when the number of calibrations with respect to the phase of at least some of the plurality of clock signals CKs exceeds the threshold number Tn1, the control logic circuit 110 may calculate the correlation value between the data DO1 to DOn using the first number n2 of bits from each of the data DO1 to DOn. In this case, the second number n2 may be greater than the first number n1.

In addition, when the number of calibrations with respect to the phase of at least some of the plurality of clock signals CKs exceeds the threshold number Tn1, the control logic circuit 110 may calculate the correlation value between the data DO1 to DOn the second number of times k2. In this case, the second number of times k2 may be greater than the first number of times k1.

Furthermore, the control logic circuit 110 may calibrate the phase of at least some of the plurality of clock signals CKs output through the delay circuit 130 based on the calculated correlation value.

Referring to the above-described configurations, when the number of calibrations with respect to the phases of the plurality of clock signals CKs is less than or equal to the threshold number Tn1, the control logic circuit 110 may calculate the correlation value between the data DO1 to DOn using a relatively small number of bits, compared to when the number of calibrations exceeds the threshold number Tn1.

This way, the ADC circuit 100A may minimize power consumed when calculating the correlation value between the data DO1 to DOn, to calibrate the sampling timing of at least some of the plurality of ADCs 120.

In addition, when the number of calibrations with respect to the phases of the plurality of clock signals CKs is less than or equal to the threshold number Tn1, the control logic circuit 110 may calculate the correlation value between the data DO1 to DOn by accumulating it a relatively small number of times, compared to the case where the number of calibrations exceeds the threshold number Tn1.

This way, the ADC circuit 100A according to an embodiment of the present disclosure may minimize the time and/or power required when calculating the correlation value between the data DO1 to DOn, to calibrate the sampling timing of at least some of the plurality of ADCs 120.

In the description of FIGS. 4B and 4C below, for convenience of description, it is assumed that the control logic circuit 110 controls the delay circuit 130 based on the first cumulative correlation value.

In this case, the first cumulative correlation value may be a value accumulated by the control logic circuit 110 that calculates the correlation value between the data DO1 to DOn the first number of times k1, using the first number n1 of bits in each of the data DO1 to DOn.

According to an embodiment, the control logic circuit 110 may determine a calibration direction for the phase of at least some of the plurality of clock signals CKs based on a sign of the first cumulative correlation value.

In addition, the control logic circuit 110 may calibrate the phase of at least some of the plurality of clock signals CKs in the calibration direction determined by the sign of the first cumulative correlation value.

For example, referring to FIG. 4B, the control logic circuit 110 may calibrate the phase of a first clock signal CK1 in a first calibration direction D1, based on the sign of the first cumulative correlation value, to be output as a first calibration clock signal CK1'.

In this case, the operation of the control logic circuit 110 to calibrate the phase of the first clock signal CK1 in the first calibration direction D1 may be referred to as the control logic circuit 110 lagging the phase of the first clock signal CK1.

For example, referring to FIG. 4C, the control logic circuit 110 may calibrate the phase of a second clock signal CK2 in a second calibration direction D2, based on the sign of the first cumulative correlation value, to be output as a second calibration clock signal CK2'.

In this case, the operation of the control logic circuit 110 to calibrate the phase of the second clock signal CK2 in the second calibration direction D2 may be referred to as the control logic circuit 110 leading the phase of the second clock signal CK2.

In addition, the control logic circuit 110 may determine a calibration amount for the phase of at least some of the plurality of clock signals CKs based on an amount of the first cumulative correlation value.

The control logic circuit 110 may control the phase of at least some of the plurality of clock signals CKs by the calibration amount based on the amount of the first cumulative correlation value.

For example, referring to FIG. 4B, the control logic circuit 110 may calibrate the phase of the first clock signal CK1 by a first calibration amount A1, based on the amount of the first cumulative correlation value, to be output as the first calibration clock signal CK1'.

As another example, referring to FIG. 4C, the control logic circuit 110 may calibrate the phase of the second clock signal CK2 by a second calibration amount A2, based on the sign of the first cumulative correlation value, to be output as the second calibration clock signal CK2'.

According to an embodiment, each of the plurality of ADCs 120 may sample the analog data AD in response to a calibrated and received clock signal.

In more detail, each of the plurality of ADCs 120 may sample the analog data AD in response to a rising edge of the calibrated and received clock signal.

For example, referring to FIG. 4B, the first ADC ADC1 may sample the analog data AD in response to the rising edge of the first calibration clock signal CK1'.

In addition, referring to FIG. 4C, a second ADC ADC2 may sample the analog data AD in response to the rising edge of the second calibration clock signal CK2'.

Referring to the above-described configurations, the control logic circuit 110 according to an embodiment may calculate the correlation value between the data DO1 to DOn, using different numbers of bits in sections that are divided according to the number of calibrations with respect to the plurality of clock signals CKs.

In addition, the control logic circuit 110 may calculate the correlation value between the data DO1 to DOn by accumulating it a different number of times in the sections divided according to the number of calibrations with respect to the plurality of clock signals CKs.

Furthermore, the control logic circuit 110 may determine the phase of at least some of the plurality of clock signals CKs output through the delay circuit 130 based on the cumulative correlation value of the correlation values calculated a different number of times.

This way, the control logic circuit 110 may calibrate the sampling timing of at least some of the plurality of ADCs 120.

Therefore, the ADC circuit 100A according to an embodiment of the present disclosure may minimize the time and power required to calculate the correlation value to calibrate the plurality of ADCs 120 while maintaining the accuracy of calibration for the sampling timing of the plurality of ADCs 120.

FIG. 5 is a block diagram illustrating an ADC circuit including a control logic circuit including a correlation circuit, according to an embodiment.

Referring to FIG. 5, an ADC circuit 100B according to an embodiment may include a control logic circuit 110A including a correlation circuit 201.

In more detail, the control logic circuit 110A according to an embodiment may include the correlation circuit 201 that calculates a correlation value between the plurality of ADCs 120.

In this case, the ADC circuit 100B and the control logic circuit 110A illustrated in FIG. 5 are an example of the ADC circuit 100 and the control logic circuit 110 illustrated in FIG. 1. Accordingly, for components that are the same or similar to the above-described components, the same reference numerals are used, and descriptions that overlap with the above-described content are omitted to avoid redundancy.

According to an embodiment, the correlation circuit 201 may calculate the correlation value between data DO1 to DOn output from the plurality of ADCs 120.

A first calculation circuit 611 may multiply the first data DO1 by the second data DO2 that is delayed by a second register 642.

In addition, a second calculation circuit 612 may multiply the second data DO2 by the first data DO1 that is delayed by a first register 641.

In this case, for example, when the number of times the control logic circuit 110A calibrates the sampling timing of the plurality of ADCs 120 is less than or equal to the threshold number Tn1, the correlation circuit 201 may use the first number n1 of bits from each of the first data DO1 and the second data DO2 for calculation.

As another example, when the number of times the control logic circuit 110A calibrates the sampling timing of the plurality of ADCs 120 exceeds the threshold number Tn1, the correlation circuit 201 may use the second number n2 of bits greater than the first number n1 of bits from each of the first data DO1 and the second data DO2 for calculation.

In addition, a third calculation circuit 613 may perform a subtraction calculation (or deduction) between the values output from the first calculation circuit 611 and the values output from the second calculation circuit 612. This way, the third calculation circuit 613 may output a first correlation value CVI between the first data DO1 and the second data DO2.

Furthermore, the correlation circuit 201 may perform a calculation by accumulating the first correlation value CVI between the first data DO1 and the second data DO2 from the first data DO1 and the second data DO2 by a specific number of times.

For example, when the number of times the control logic circuit 110A calibrates the sampling timing of the plurality of ADCs 120 is less than or equal to the threshold number Tn1, the correlation circuit 201 may calculate the first correlation value CVI between the first data DO1 and the second data DO2 the first number of times k1.

As another example, when the number of times the control logic circuit 110A calibrates the sampling timing of the plurality of ADCs 120 exceeds the threshold number Tn1, the correlation circuit 201 may calculate the first correlation value CVI between the first data DO1 and the second data DO2 the second number of times k2 greater than the first number of times k1.

Referring to the above-described configurations, when the number of times the sampling timing of the plurality of ADCs 120 is calibrated is less than or equal to the threshold number Tn1, the control logic circuits 110A may calculate the correlation value between the data DO1 to DOn using a relatively small number of bits, compared to the case where the number of calibrations exceeds the threshold number Tn1.

This way, the ADC circuit 100B may minimize power consumed when calculating the correlation value between the data DO1 to DOn, to calibrate the sampling timing of at least some of the plurality of ADCs 120.

In addition, when the number of times the sampling timing of the plurality of ADCs 120 is calibrated is less than or equal to the threshold number Tn1, the control logic circuit 110A may perform the calculation by accumulating the correlation value between the data DO1 to DOn a relatively small number of times, compared to the case where the number of calibrations exceeds the threshold number Tn1.

Therefore, when the number of times the sampling timing of the plurality of ADCs 120 is calibrated is less than or equal to the threshold number Tn1, the control logic circuit 110A may calculate the correlation value between the data DO1 to DOn at a relatively faster rate, compared to the case where the number of calibrations exceeds the threshold number Tn1.

This way, the ADC circuit 100B according to an embodiment of the present disclosure may minimize the time and/or power required when calculating the correlation value between the data DO1 to DOn, to calibrate the sampling timing of at least some of the plurality of ADCs 120.

Further, when the number of times the sampling timing of the plurality of ADCs 120 is calibrated exceeds the threshold number Tn1, the control logic circuit 110A may increase the number of bits used to calculate the correlation value between the data DO1 to DOn.

In addition, when the number of times the sampling timing of the plurality of ADCs 120 is calibrated exceeds the threshold number Tn1, the control logic circuit 110A may increase the number calculations by accumulating correlation values between the data DO1 to DOn.

This way, the ADC circuit 100B according to an embodiment of the present disclosure may enhance the precision of calibration concerning the sampling timing of the plurality of ADCs 120.

FIG. 6 is a flowchart illustrating a method in which a control logic circuit calibrates a phase of at least some of a plurality of ADCs, according to an embodiment.

Referring to FIG. 6, the control logic circuit 110 according to an embodiment may calculate the correlation value between data output from the plurality of ADCs 120 to calibrate the sampling timing of at least some of the plurality of ADCs 120.

In more detail, the control logic circuit 110 may use different numbers of bits from each data within sections divided based on the sampling timing of the plurality of ADCs 120, and calculate the correlation value between the data a different number of times.

Furthermore, the control logic circuit 110 may calibrate the sampling timing of at least some of the plurality of ADCs 120, using the cumulative correlation value determined from the accumulation of correlation values calculated a different number of times.

In operation S10, the control logic circuit 110 according to an embodiment may calculate the correlation value between the data DO1 to DOn the first number of times k1 using the first number n1 of bits from each of the data DO1 to DOn output from the plurality of ADCs 120.

In more detail, the control logic circuit 110 may calculate the correlation value between the data DO1 to DOn using the first number n1 of bits from each of the data DO1 to DOn output from the plurality of ADCs 120.

In addition, the control logic circuit 110 may calculate the correlation value between the data DO1 to DOn output from the plurality of ADCs 120 the first number of times k1.

In this way, the control logic circuit 110 may generate a first cumulative correlation value that includes correlation values between the data DO1 to DOn calculated the first number of times k1.

In operation S20, the control logic circuit 110 according to an embodiment may calibrate the sampling timing of at least some of the plurality of ADCs 120 based on the first cumulative correlation value.

In more detail, the control logic circuit 110 may calibrate a phase of at least some of the plurality of clock signals CKs input to the plurality of ADCs 120 based on the first cumulative correlation value.

For example, the control logic circuit 110 may calibrate the phase of at least some of the plurality of clock signals CKs input to the plurality of ADCs 120 based on the calibration direction identified by the sign of the first cumulative correlation value.

In addition, the control logic circuit 110 may calibrate the phase of at least some of the clock signals CKs input to the plurality of ADCs 120 according to the calibration amount determined by the first cumulative correlation value.

In this way, the control logic circuit 110 may control the timing at which each of the plurality of ADCs 120 samples the analog data AD.

In operation S30, the control logic circuit 110 according to an embodiment may calculate the correlation value between the data DO1 to DOn the second number of times k2 using the second number n2 of bits from each of the data DO1 to DOn output from the plurality of ADCs 120.

In more detail, the control logic circuit 110 may calculate the correlation value between the data DO1 to DOn using the second number n2 of bits from each of the data DO1 to DOn output from the plurality of ADCs 120. In this case, the second number n2 may be larger than the first number n1.

In addition, for example, each of the data DO1 to DOn output from the plurality of ADCs 120 may be output with the second number n2 of bits.

In detail, the control logic circuit 110 may calculate the correlation value between the data DO1 to DOn using all bits of each of the data DO1 to DOn output from the plurality of ADCs 120.

In addition, the control logic circuit 110 may calculate the correlation value between the data DO1 to DOn output from the plurality of ADCs 120 the second number of times k2. In this case, the second number of times k2 may be greater than the first number of times k1.

In this way, the control logic circuit 110 may generate a second cumulative correlation value including correlation values between the data DO1 to DOn calculated the second number of times k2.

In operation S40, the control logic circuit 110 according to an embodiment may calibrate the sampling timing of at least some of the plurality of ADCs 120 based on the second cumulative correlation value.

In more detail, the control logic circuit 110 may calibrate the phase of at least some of the plurality of clock signals CKs input to the plurality of ADCs 120 based on the second cumulative correlation value.

For example, the control logic circuit 110 may calibrate the phase of at least some of the plurality of clock signals CKs input to the plurality of ADCs 120 based on the calibration direction identified by the sign of the second cumulative correlation value.

In addition, the control logic circuit 110 may calibrate the phase of at least some of the clock signals CKs input to the plurality of ADCs 120 by the calibration amount determined by the second cumulative correlation value.

In this way, the control logic circuit 110 may control the timing at which each of the plurality of ADCs 120 samples the analog data AD.

Referring to the above-described configurations, the control logic circuit 110 may calculate the correlation value between the data DO1 to DOn using different numbers of bits in distinct operations (e.g., operations S10 and S30).

The ADC circuit 100 calculates the correlation value between the data DO1 to DOn using a relatively small number of bits, thereby minimizing the power consumed when calculating the correlation value between the data DO1 to DOn.

In addition, the control logic circuit 110 may calculate the correlation value between the data DO1 to DOn a different number of times in distinct operations (e.g., operations S10 and S30).

The ADC circuit 100 calculates the correlation value between the data DO1 to DOn a relatively small number of times, thereby minimizing the time and/or power required in the process of calculating the correlation value between the data DO1 to DOn.

Moreover, the control logic circuit 110 may increase the number of bits used to calculate the correlation value between the data DO1 to DOn. In addition, the control logic circuit 110 may increase the number of times to calculate the correlation value between the data DO1 to DOn.

Furthermore, the control logic circuit 110 may calibrate the sampling timing of at least some of the plurality of ADCs 120 using the cumulative correlation value wherein correlation values, calculated an increased number of times, are accumulated employing the greater number of bits.

In this way, the ADC circuit 100 according to an embodiment of the present disclosure may enhance the calibration accuracy concerning the sampling timing of the plurality of ADCs 120.

In detail, the ADC circuit 100 according to an embodiment of the present disclosure may minimize the time and/or power required to calculate the correlation value use to calibrate the sampling timing of the plurality of ADCs 120 while maintaining the calibration accuracy of the sampling timing of the plurality of ADCs 120.

FIG. 7 is a flowchart illustrating a method in which a control logic circuit according to an embodiment calculates a correlation value between data output from a plurality of ADCs a different number of times using different numbers of bits depending on the number of calibrations.

Referring to FIG. 7, the control logic circuit 110 according to an embodiment may calculate the correlation value between data DO1 to DOn a different number of times with different numbers of bits depending on whether the number of calibrations for the sampling timing of the plurality of ADCs 120 exceeds the threshold number.

In this case, operation S10 and operation S20 illustrated in FIG. 7 may be the same operations as operation S10 and operation S20 illustrated in FIG. 6. Therefore, descriptions that overlap with the above-described content will be omitted to avoid redundancy.

In operation S21, the control logic circuit 110 according to an embodiment may increase the calibration count.

In more detail, the control logic circuit 110 may increase the calibration count in response to calibrating the sampling timing of at least some of the plurality of ADCs 120 based on the first cumulative correlation value.

For example, the control logic circuit 110 may increase the calibration count by "1" in response to calibrating the sampling timing of at least some of the plurality of ADCs 120.

In this case, the calibration count refers to the number of times the sampling timing of at least some of the plurality of ADCs 120 is calibrated based on the cumulative correlation value calculated by the control logic circuit 110.

In operation S23, the control logic circuit 110 according to an embodiment may determine whether the calibration count exceeds a first threshold number.

In more detail, the control logic circuit 110 may determine whether the calibration count exceeds the first threshold number when the calibration count is increased.

According to an embodiment, when the calibration count is less than or equal to the first threshold number, the control logic circuit 110 may calculate the correlation value between the data DO1 to DOn using the first number n1 of bits in each of the data DO1 to DOn.

In addition, when the calibration count is less than or equal to the first threshold number, the control logic circuit 110 may calculate the correlation value between the data DO1 to DOn the first number of times k1.

In addition, the control logic circuit 110 may calibrate the sampling timing of at least some of the plurality of ADCs 120 based on a first cumulative correlation value, which is obtained by accumulating correlation values calculated the first number of times k1.

In detail, the control logic circuit 110 may calibrate the sampling timing of at least some of the plurality of ADCs 120 by a preset first threshold number based on the first cumulative correlation value.

According to another embodiment, when the calibration count exceeds the first threshold number, the control logic circuit 110 may calculate the correlation value between the data DO1 to DOn using the second number n2 of bits in each of the data DO1 to DOn.

In this case, the second number n2 may be larger than the first number n1.

In addition, for example, each of the data DO1 to DOn output from the plurality of ADCs 120 may be output with the second number n2 of bits.

In detail, when the calibration count exceeds the first threshold number, the control logic circuit 110 may calculate the correlation value between the data DO1 to DOn using all bits of each of the data DO1 to DOn.

In addition, when the calibration count exceeds the first threshold number, the control logic circuit 110 may calculate the correlation value between the data DO1 to DOn the second number of times k2 greater than the first number of times k1.

In addition, the control logic circuit 110 may calibrate the sampling timing of at least some of the plurality of ADCs 120 based on a second cumulative correlation value, which is obtained by accumulating correlation values calculated the second number of times k2.

Referring to the above-described configurations, the control logic circuit 110 may calculate the correlation value between the data DO1 to DOn using different numbers of bits depending on the number of calibrations for the sampling timing of the plurality of ADCs 120.

When the number of calibrations for the sampling timing of the plurality of ADCs 120 is less than or equal to the first threshold number, the control logic circuit 110 may calculate the correlation value between DO1 to Don using a relatively small number of bits, compared to when the number of calibrations exceeds the first threshold number.

In this way, the ADC circuit 100 according to an embodiment of the present disclosure may minimize power consumed in the process of calculating the correlation value between the data DO1 to DOn, to calibrate the sampling timing of at least some of the plurality of ADCs 120.

In addition, the control logic circuit 110 may calculate the correlation value between the data DO1 to DOn by accumulating it a different number of times depending on the number of calibrations for the sampling timing of the plurality of ADCs 120.

In this way, the ADC circuit 100 according to an embodiment of the present disclosure may minimize the time and/or power required in the process of calculating the correlation value between the data DO1 to DOn, to calibrate the sampling timing of at least some of the plurality of ADCs 120.

When the number of calibrations for the sampling timing of the plurality of ADCs 120 exceeds the first threshold number, the control logic circuit 110 may increase the number of bits used to calculate the correlation value between the data DO1 to DOn.

In addition, when the number of calibrations for the sampling timing of the plurality of ADCs 120 exceeds the first threshold number, the control logic circuit 110 may increase the number of calculations performed by accumulating correlation values between the data DO1 to DOn.

In this way, the ADC circuit 100 according to an embodiment of the present disclosure may improve the calibration accuracy of the sampling timing of the plurality of ADCs 120.

In addition, the ADC circuit 100 according to an embodiment of the present disclosure may minimize the time and power required to calculate the correlation value used to calibrate at least some of the plurality of ADCs 120 while maintaining the calibration accuracy of the plurality of ADCs 120.

FIG. 8A is a flowchart illustrating a method in which a control logic circuit according to an embodiment controls a phase of a clock signal in a calibration direction depending on a sign of a first cumulative correlation value. FIG. 8B is a flowchart illustrating a method in which a control logic circuit according to an embodiment controls a phase of a clock signal by a calibration amount depending on an amount of a first cumulative correlation value.

Referring to FIGS. 8A and 8B, the control logic circuit 110 according to an embodiment may control (or calibrate or adjust) the phase of at least some of the plurality of clock signals CKs based on the first cumulative correlation value.

In more detail, referring to FIG. 8A, the control logic circuit 110 may calibrate the phase of at least some of the plurality of clock signals CKs based on the sign of the first cumulative correlation value.

In operation S211, the control logic circuit 110 may determine a calibration direction for the phase of at least some of the plurality of clock signals CKs based on the sign of the first cumulative correlation value.

For example, the control logic circuit 110 may determine the calibration direction for the phase of the first clock signal CK1 by using the sign of the cumulative correlation value between the first data DO1 and the other data DO2 to DOn.

For example, the control logic circuit 110 may determine whether to lead or lag the phase of the first clock signal CK1 based on the sign of the cumulative correlation value between the first data DO1 and the other data DO2 to DOn.

In operation S212, the control logic circuit 110 may calibrate the phase of at least some of the plurality of clock signals CKs in the calibration direction determined by the sign of the first cumulative correlation value.

For example, the control logic circuit 110 may calibrate the phase of the first clock signal CK1 in the calibration direction determined by the sign of the cumulative correlation value between the first data DO1 and the other data DO2 to DOn.

In addition, referring to FIG. 8B, the control logic circuit 110 may calibrate the phase of at least some of the plurality of clock signals CKs based on the amount of the first cumulative correlation value.

In operation S221, the control logic circuit 110 may determine a calibration amount for the phase of at least some of the plurality of clock signals CKs based on the amount of the first cumulative correlation value.

For example, the control logic circuit 110 may determine the calibration amount for the phase of the first clock signal CK1 based on the sign of the cumulative correlation value between the first data DO1 and the other data DO2 to DOn.

In operation S222, the control logic circuit 110 may calibrate the phase of at least some of the plurality of clock signals CKs by the calibration amount determined based on the amount of the first cumulative correlation value.

For example, the control logic circuit 110 may calibrate the phase of the first clock signal CK1 by the calibration amount determined based on the amount of the cumulative correlation value between the first data DO1 and the other data DO2 to DOn.

Referring to the above-described configurations, the control logic circuit 110 according to an embodiment may calibrate the phase of at least some of the plurality of clock signals CKs input to the plurality of ADCs 120 based on the cumulative correlation value calculated a specified number of times.

In this way, the control logic circuit 110 may calibrate the timing at which each of the plurality of ADCs 120 samples the input analog data AD.

In addition, the ADC circuit 100 according to an embodiment of the present disclosure may improve the accuracy in calibrating the sampling timing of the plurality of ADCs 120.

FIG. 9 is a flowchart illustrating a method in which a control logic circuit according to an embodiment calibrates a sampling timing of at least some of a plurality of ADCs based on a third cumulative correlation value. FIG. 10A is a diagram illustrating a first number of bits used by a control logic circuit according to an embodiment to calculate a correlation value between data output from ADCs. FIG. 10B is a diagram illustrating a second number of bits used by a control logic circuit according to an embodiment to calculate a correlation value between data output from ADCs. FIG. 10C is a diagram illustrating a third number of bits used by a control logic circuit according to an embodiment to calculate a correlation value between data output from ADCs.

Referring to FIGS. 9 to 10C together, the control logic circuit 110 according to an embodiment may calculate the correlation value between the data DO1 to DOn a different number of times with different numbers of bits, depending on whether the number of calibrations for the sampling timing of the plurality of ADCs 120 exceeds the threshold number Tn1.

In operation S30, the control logic circuit 110 according to an embodiment may calculate the correlation value between the data DO1 to DOn using the second number n2 of bits in each of the data DO1 to DOn output from the plurality of ADCs 120.

The control logic circuit 110 may calculate the correlation value between the data DO1 to DOn using the second number n2 of bits greater than the first number n1 of bits in each of the data DO1 to DOn output from the plurality of ADCs 120.

For example, referring to FIGS. 10A and 10B, the control logic circuit 110 may calculate the correlation value between the first data DO1 and the second data DO2 using the second number n2 of bits greater than the first number n1 of bits in each of the first data DO1 and the second data DO2.

In this case, the second number n2 of bits may be some bits including the most significant bit (MSB) among the bits of each of the first data DO1 and the second data DO2.

In addition, the control logic circuit 110 may cumulatively calculate the correlation value between the data DO1 to DOn the second number of times k2 using the second number n2 of bits in each of the data DO1 to DOn output from the plurality of ADCs 120.

In this case, the second number of times k2 may be greater than the first number of times k1.

In this way, the control logic circuit 110 may generate a second cumulative correlation value including correlation values between the data DO1 to DOn cumulatively calculated the second number of times k2.

In operation S40, the control logic circuit 110 according to an embodiment may calibrate the sampling timing of at least some of the plurality of ADCs 120 based on the second cumulative correlation value.

In more detail, the control logic circuit 110 may calibrate the phase of at least some of the plurality of clock signals CKs input to the plurality of ADCs 120 based on the second cumulative correlation value.

For example, the control logic circuit 110 may calibrate the phase of at least some of the plurality of clock signals CKs input to the plurality of ADCs 120 based on the calibration direction identified by the sign of the second cumulative correlation value.

In addition, the control logic circuit 110 may calibrate the phase of at least some of the clock signals CKs input to the plurality of ADCs 120 by the calibration amount determined based on the second cumulative correlation value.

In this way, the control logic circuit 110 may control the timing at which each of the plurality of ADCs 120 samples the analog data AD.

Furthermore, in operation S41, the control logic circuit 110 according to an embodiment may increase the calibration count.

In more detail, the control logic circuit 110 may increase the calibration count in response to calibrating the sampling timing of at least some of the plurality of ADCs 120 based on the second cumulative correlation value.

For example, the control logic circuit 110 may increase the calibration count by "1" in response to calibrating the sampling timing of at least some of the plurality of ADCs 120.

In this case, the calibration count may be referred to as the number of times the control logic circuit 110 calibrates the sampling timing of at least some of the plurality of ADCs 120.

In operation S43, the control logic circuit 110 according to an embodiment may determine whether the calibration count exceeds the second threshold number.

In more detail, the control logic circuit 110 may determine whether the calibration count exceeds a second threshold number that is greater than the first threshold number.

In operation S50, the control logic circuit 110 may calculate the correlation value between the data DO1 to DOn the third number of times k3 using the third number n3 of bits in each of the data DO1 to DOn output from the plurality of ADCs 120.

In more detail, when the calibration count exceeds second threshold number, the control logic circuit 110 may calculate the correlation value between the data DO1 to DOn the third number of times k3 using the third number n3 of bits in each of the data DO1 to DOn.

According to an embodiment, the control logic circuit 110 may calculate the correlation value between the data DO1 to DOn using the third number n3 of bits greater than the second number n2 of bits in each of the data DO1 to DOn output from the plurality of ADCs 120.

For example, referring to FIG. 10C, the control logic circuit 110 may calculate the correlation value between the first data DO1 and the second data DO2 using the third number n3 of bits greater than the second number n2 of bits in each of the first data DO1 and the second data DO2.

In addition, for example, each of the data DO1 to DOn output from the plurality of ADCs 120 may be output with the third number n3 of bits.

In detail, the control logic circuit 110 may calculate the correlation value between the data DO1 to DOn using all bits of each of the data DO1 to DOn output from the plurality of ADCs 120.

In addition, the control logic circuit 110 may calculate the correlation value between the data DO1 to DOn output from the plurality of ADCs 120 the third number of times k3.

In this case, the third number of times k3 may be greater than the second number of times k2.

In this way, the control logic circuit 110 may generate a third cumulative correlation value including correlation values between the data DO1 to DOn calculated the third number of times k3.

In operation S60, the control logic circuit 110 according to an embodiment may calibrate the sampling timing of at least some of the plurality of ADCs 120 based on the third cumulative correlation value.

In more detail, the control logic circuit 110 may calibrate the phase of at least some of the plurality of clock signals CKs input to the plurality of ADCs 120 based on the third cumulative correlation value.

For example, the control logic circuit 110 may calibrate the phase of at least some of the plurality of clock signals CKs input to the plurality of ADCs 120 based on the calibration direction identified by the sign of the third cumulative correlation value.

In addition, the control logic circuit 110 may calibrate the phase of at least some of the clock signals CKs input to the plurality of ADCs 120 by the calibration amount determined based on the third cumulative correlation value.

In this way, the control logic circuit 110 may control the timing at which each of the plurality of ADCs 120 samples the analog data AD.

Referring to the above-described configurations, the control logic circuit 110 may calculate the correlation between the data DO1 to DOn using a relatively small number of bits while calibrating the sampling timing of the plurality of ADCs 120 a specific number of times.

In this way, the ADC circuit 100 may minimize power consumed in the process of calculating the correlation value between the data DO1 to DOn, to calibrate the sampling timing of at least some of the plurality of ADCs 120.

In addition, the control logic circuit 110 may calculate the correlation value between the data DO1 to DOn a relatively small number of times while calibrating the sampling timing of the plurality of ADCs 120 a specific number of times.

In this way, the ADC circuit 100 may minimize the time and/or power required in the process of calculating the correlation value between the data DO1 to DOn, to calibrate the sampling timing of at least some of the plurality of ADCs 120.

In addition, the control logic circuit 110 may increase the number of bits used to calculate the correlation value between the data DO1 to DOn.

In addition, the control logic circuit 110 may increase the number of times to calculate the correlation value between the data DO1 to DOn.

Furthermore, the control logic circuit 110 may calibrate the sampling timing of at least some of the plurality of ADCs 120 based on the cumulative correlation value, which is obtained by accumulating correlation values calculated the increased number of times using the increased number of bits.

In this way, the ADC circuit 100 according to an embodiment of the present disclosure may improve the accuracy of calibration with respect to the sampling timing of the plurality of ADCs 120.

In addition, the ADC circuit 100 according to an embodiment of the present disclosure may minimize the time and/or power required to calculate the correlation value for calibrating at least some of the plurality of ADCs 120 while maintaining the accuracy of calibration with respect to the plurality of ADCs 120.

FIG. 11 is a block diagram illustrating an electronic device including an antenna and an ADC circuit, according to an embodiment.

Referring to FIG. 11, the electronic device 10 may include an ADC circuit 100C and an antenna 1110.

In this case, the ADC circuit 100C illustrated in FIG. 11 is an example of the ADC circuit 100 illustrated in FIG. 1.

Accordingly, the same reference numerals are used for components that are the same or similar to the above-described components, and additional descriptions that may overlap with the above-described content will be omitted to avoid redundancy.

In more detail, the electronic device 10 may include the ADC circuit 100C configured to convert the analog data AD to the digital data DO.

The electronic device 10 according to an embodiment may include the antenna 1110 that receives a radio frequency (RF) signal and transmits the analog data AD to the ADC circuit 100C.

In addition, the electronic device 10 may include an analog front end (AFE) that receives an RF signal of a predetermined frequency and converts the RF signal into the analog data AD. In this case, the AFE may be disposed between the antenna 1110 and the ADC circuit 100C.

According to an embodiment, the antenna 1110 may receive an RF signal transferred from an external source and may transmit the analog data AD generated from the RF signal to the ADC circuit 100C.

According to another embodiment, the antenna 1110 may convert an analog signal transmitted from the ADC circuit into an RF signal with a designated frequency and transmit it to the outside.

According to an embodiment, the ADC circuit 100C may convert the analog data AD received through the antenna 1110 into the digital data DO to be output.

In more detail, the control logic circuit 110 may control the plurality of ADCs 120 to convert the analog data AD received through the antenna 1110 into the digital data DO to be output.

In this case, each of the plurality of ADCs 120 may sample the analog data AD received from the outside based on clock signals having different phases, enabling it to be output as the digital data DO.

Accordingly, the plurality of ADCs 120 may be referred to as a time-interleaved (TI) ADC. In addition, each of the plurality of ADCs 120 (e.g., ADC1 to ADCn) may be referred to as a sub-ADC.

In addition, the control logic circuit 110 according to an embodiment may calibrate the sampling timing of at least some of the plurality of ADCs 120 based on the digital data DO output from the plurality of ADCs 120.

In more detail, the control logic circuit 110 may calculate a correlation value between the data DO1 to DOn output from the plurality of ADCs 120 based on the digital data DO output from the plurality of ADCs 120.

Furthermore, the control logic circuit 110 may calibrate the sampling timing of at least some of the plurality of ADCs 120 based on the calculated correlation value.

In addition, the control logic circuit 110 may increase the calibration count in response to calibrating the sampling timing of at least some of the plurality of ADCs 120. In this case, the calibration count may be the number of times the control logic circuit 110 calibrates the sampling timing of at least some of the plurality of ADCs 120.

According to an embodiment, when the calibration count is less than or equal to the threshold number Tn1, the control logic circuit 110 may calculate the correlation value between the data DO1 to DOn using the first number n1 of bits in each of the data DO1 to DOn.

In this case, the first number n1 of bits may be a number less than the number of bits of each of the data DO1 to DOn.

In addition, in this case, the control logic circuit 110 may calculate the correlation value between the data DO1 to DOn using the first number n1 of bits from the most significant bit (MSB) of each of the data.

In detail, when the number of calibrations with respect to at least some of the plurality of ADCs 120 is less than or equal to the threshold number Tn1, the control logic circuit 110 may calculate the correlation value between the data DO1 to DOn using some bits including the most significant bit (MSB) in each of the data DO1 to DOn.

In addition, when the calibration count is less than or equal to the threshold number Tn1, the control logic circuit 110 may calculate the correlation value between the data DO1 to DOn the first number of times k1.

Furthermore, the control logic circuit 110 may calibrate the sampling timing of at least some of the plurality of ADCs 120 based on a first cumulative correlation, where correlation values calculated the first number of times k1 are accumulated.

In contrast, when the calibration count exceeds the threshold number Tn1, the control logic circuit 110 may calculate the correlation value between DO1 to DOn using the second number n2 of bits greater than the first number n1 of bits in each of the data DO to DOn.

In addition, when the calibration count exceeds the threshold number Tn1, the control logic circuit 110 may calculate the correlation value between the data DO1 to DOn the second number of times k2 greater than the first number of times k1.

Furthermore, the control logic circuit 110 may calibrate the sampling timing of at least some of the plurality of ADCs 120 based on a second cumulative correlation, where correlation values calculated the second number of times k2 are accumulated.

Referring to the above-described configuration, when the calibration count is less than or equal to the threshold number Tn1, the control logic circuit 110 may calculate the correlation value between the data DO1 to DOn using a relatively small number of bits compared to the case where the calibration count exceeds the threshold number Tn1.

In this way, the ADC circuit 100 according to an embodiment of the present disclosure may minimize power consumed in the process of calculating the correlation value between the data DO1 to DOn, to calibrate the sampling timing of at least some of the plurality of ADCs 120.

In addition, when the calibration count is less than or equal to the threshold number Tn1, the control logic circuit 110 may calculate the correlation value between the data DO1 to DOn by a relatively small number of times compared to when the calibration count exceeds the threshold number Tn1.

In this way, the ADC circuit 100 according to an embodiment of the present disclosure may minimize the time and/or power required in the process of calculating the correlation value between the data DO1 to DOn, to calibrate the sampling timing of at least some of the plurality of ADCs 120.

In addition, when the calibration count exceeds the threshold number Tn1, the control logic circuit 110 may increase the number of bits used to calculate the correlation value between the data DO1 to DOn and/or the number of calculations performed through accumulation of the correlation value between the data DO1 to DOn.

Furthermore, the control logic circuit 110 may calibrate the sampling timing of at least some of the plurality of ADCs 120 based on the second cumulative correlation value in which correlation values calculated the increased number of times are accumulated using the increased number of bits.

In this way, the ADC circuit 100 according to an embodiment of the present disclosure may improve the accuracy of calibration with respect to the sampling timing of the plurality of ADCs 120.

In addition, the ADC circuit 100 may minimize the time and power required to calculate the correlation value for calibrating at least some of the plurality of ADCs 120 while maintaining the accuracy of calibration with respect to the plurality of ADCs 120.

FIG. 12 is a block diagram illustrating an Internet of Things (IoT) device including an ADC circuit, according to an embodiment.

Referring to FIG. 12, an IoT may refer to a network between things using wired and/or wireless communication. An IoT device may include an accessible wired or/and wireless interface and may include devices that communicate with at least one or more other devices through the wired or/and wireless interface to transmit or receive data. The accessible interface that the IoT device includes may include a modem communication interface that is accessible to a local area network (LAN), a wireless local area network (WLAN) such as a wireless fidelity (Wi-Fi), a wireless personal area network (WPAN) such as Bluetooth, a wireless universal serial bus (USB), a Zigbee, a near field communication (NFC), a radio frequency identification (RFID), a power line communication (PLC), or mobile cellular networks such as 3rd generation (3G), long term evolution (LTE), 4th generation (4G), or 5th generation (5G). The Bluetooth interface may support Bluetooth low energy (BLE).

In detail, the IoT device 1200 may include a communication interface 1220 for communicating with the outside. The communication interface 1220 may be, for example, a modem communication interface that is accessible to the local area network (LAN), a wireless local area network communication interface such as Bluetooth, Wi-Fi, or Zigbee, or a mobile communication network such as PLC, 3G, LTE, 4G, or 5G.

The communication interface 1220 may include a transmitter and a receiver. In this case, the communication interface 1220 illustrated in FIG. 12 may include the antenna 1110 of FIG. 11.

The IoT device 1200 may transmit and/or receive information from an access point or a gateway through the antenna 1110. In addition, the IoT device 1200 may communicate with a user device or any other IoT device to transmit and/or receive control information or data of the IoT device 1200.

The IoT device 1200 may include a processor 1210 for performing calculations. In this case, the processor 1210 illustrated in FIG. 12 may be have the same or similar configuration as the control logic circuit 110 illustrated in FIG. 1 or FIG. 11.

According to an embodiment, the processor 1210 may control the plurality of ADCs 120 included in the ADC circuit 100 to convert the analog data AD into the digital data DO to be output.

In this case, the processor 1210 may calculate the correlation value between the data DO1 to DOn using different numbers of bits depending on the number of calibrations with respect to the sampling timing of at least some of the plurality of ADCs 120.

In addition, the processor 1210 may calculate the correlation value between the data DO1 to DOn a different number of times depending on the number of calibrations with respect to the sampling timing of at least some of the plurality of ADCs 120.

Furthermore, the processor 1210 may calibrate the sampling timing of at least some of the plurality of ADCs 120 based on a cumulative correlation value including the calculated correlation value.

In this way, the processor 1210 (or the ADC circuit 100) may minimize the time and power required to calculate correlation values for calibrating at least some of the plurality of ADCs 120.

The IoT device 1200 may have a built-in battery to supply internal power or may further include a power supply unit that receives power from an external source. In addition, the IoT device 1200 may include a display 1240 for displaying internal status or data. A user may control the IoT device 1200 through a user interface (UI) of the display 1240 of the IoT device 1200.

A memory 1230 may store control instruction codes, control data, or user data that control the IoT device 1200. The memory 1230 may include at least one of a volatile memory or a nonvolatile memory. The nonvolatile memory may include at least one of various memories such as a read only memory (ROM), a programmable ROM (PROM), an electrically programmable ROM (EPROM), an electrically erasable and programmable ROM (EEPROM), a flash memory, a phase-change random access memory (RAM) (PRAM), a magnetic RAM (MRAM), a resistive RAM (ReAM), and a ferroelectric RAM (FRAM). The volatile memory may include at least one of various memories such as a dynamic RAM (DRAM), a static RAM (SRAM), and a synchronous DRAM (SDRAM).

The IoT device 1200 may further include a storage device. The storage device may include at least one of nonvolatile media such as a hard disk drive (HDD), a solid state drive (SSD), an embedded multi-media card (eMMC), and universal flash storage (USF). The storage device may store user information provided through an input/output (I/O) unit 1250 and sensing information collected through a sensor 1260.

FIG. 13 is a block diagram illustrating a mobile terminal to which an ADC circuit is applied, according to an embodiment.

Referring to FIG. 13, a mobile terminal 1000 may include a processor 1300, a memory 1400, a display 1500, and a radio frequency module (RF module) 1510. In addition, the mobile terminal 1000 may further include various components such as a lens, a sensor, and an audio module.

The processor 1300 may be implemented as a system on chip (SoC), and may include a central processing unit (CPU) 1310, a RAM 1320, a power management unit (PMU) 1330, a memory interface 1340, a display controller (DCON) 1350, a MODEM 1360, and a bus 1370. In addition, the processor 1300 may further include various intellectual properties. The processor 1300 may be referred to as a "ModAP" as the function of a MODEM chip may be integrated therein.

In this case, the processor 1300 illustrated in FIG. 13 may have the same or similar configuration as the control logic circuit 110 illustrated in FIG. 1 or FIG. 11.

The CPU 1310 may control overall operations of the processor 1300 and the mobile terminal 1000. The CPU 1310 may control an operation of each component of the processor 1300. In addition, the CPU 1310 may be implemented with a multi-core. The multi-core may be one computing component having two or more independent cores.

The RAM 1320 may temporarily store programs, data, or instructions. For example, the programs and/or data stored in the memory 1400 may be temporarily stored in the RAM 1320 under control of the CPU 1310 or depending on a booting code. The RAM 1320 may be implemented with a DRAM or an SRAM.

The PMU 1330 may manage power of each component of the processor 1300. The PMU 1330 may also determine an operating situation of each component of the processor 1300 and may control an operation thereof.

The memory interface 1340 may control overall operations of the memory 1400 and may control data exchange of the memory 1400 and each component of the processor 1300. Depending on a request of the CPU 1310, the memory interface 1340 may write data in the memory 1400 or may read data from the memory 1400.

The display controller 1350 may provide the display 1500 with image data to be displayed on the display 1500. The display 1500 may be implemented as a flat panel display, such as a liquid crystal display (LCD) or an organic light emitting diode (OLED), or a flexible display.

For wireless communication, the MODEM 1360 may modulate data to be transmitted to be appropriate for a wireless environment and may recover received data. The MODEM 1360 may perform digital communication with the RF module 1510.

In detail, the MODEM 1360 may be include the ADC circuit 100 illustrated in FIG. 1.

Accordingly, the MODEM 1360 may use the plurality of ADCs 120 to convert the analog data AD of the RF signal received from the RF module 1510 into the digital data DO to be output.

The RF module 1510 may convert a high-frequency signal received through an antenna into a low-frequency signal and may transmit the converted low-frequency signal to the MODEM 1360. In addition, the RF module 1510 may convert a low-frequency signal received from the MODEM 1360 into a high-frequency signal and may transmit the converted high-frequency signal to the outside of the mobile terminal 1000 through an antenna. The RF module 1510 may amplify or filter a signal.

In this case, the RF module 1510 illustrated in FIG. 13 may include the antenna 1110 illustrated in FIG. 11.

According to an embodiment, the processor 1300 may calculate the correlation value between the data DO1 to DOn using different numbers of bits depending on the number of calibrations with respect to the sampling timing of at least some of the plurality of ADCs 120 included in the MODEM 1360.

In addition, the processor 1300 may cumulatively calculate the correlation value between the data DO1 to DOn a different number of times depending on the number of calibrations with respect to the sampling timing of at least some of the plurality of ADCs 120.

In this way, the processor 1300 may minimize the time and power required to calculate correlation values for calibrating at least some of the plurality of ADCs 120 while maintaining the accuracy of calibration with respect to the plurality of ADCs 120.

As described above, the control logic circuit 110 according to an embodiment of the present disclosure may calculate the correlation value between the data DO1 to DOn using a relatively small number of bits in each data when the calibration count is less than or equal to the threshold number Tn1, compared to when the calibration count exceeds the threshold number Tn1.

In this way, the ADC circuit 100 according to an embodiment of the present disclosure may minimize power consumed in the process of calculating the correlation value between the data DO1 to DOn, to calibrate the sampling timing of at least some of the plurality of ADCs 120.

In addition, when the calibration count is less than or equal to the threshold number Tn1, the control logic circuit 110 may calculate the correlation value between the data DO1 to DOn by accumulating a relatively small number of times compared to when the calibration count exceeds the threshold number Tn1.

Accordingly, the control logic circuit 110 may calculate the correlation value between the data DO1 to DOn at a relatively faster rate when the calibration count is less than or equal to the threshold number Tn1, compared to when the calibration count exceeds the threshold number Tn1.

In this way, the ADC circuit 100 according to an embodiment of the present disclosure may minimize the time and/or power required in the process of calculating the correlation value between the data DO1 to DOn, to calibrate the sampling timing of at least some of the plurality of ADCs 120.

In contrast, when the calibration count exceeds the threshold number Tn1, the control logic circuit 110 may increase the number of bits used to calculate the correlation value between the data DO1 to DOn.

In addition, when the calibration count exceeds the threshold number Tn1, the control logic circuit 110 may increase the number of calculations performed through accumulation of the correlation values between the data DO1 to DOn.

Furthermore, the control logic circuit 110 may calibrate the sampling timing of at least some of the plurality of ADCs 120 based on the cumulative correlation value, where correlation values calculated the increased number of times are accumulated using the increased number of bits.

In this way, the ADC circuit 100 according to an embodiment of the present disclosure may improve the accuracy of calibration with respect to the sampling timing of the plurality of ADCs 120.

In detail, the control logic circuit 110 may calculate the correlation value between the data DO1 to DOn using different numbers of bits depending on the number of calibrations with respect to the sampling timing of at least some of the plurality of ADCs 120.

In addition, the control logic circuit 110 may calculate the correlation value between the data DO1 to DOn by accumulating it a different number of times depending on the number of calibrations with respect to the sampling timing of at least some of the plurality of ADCs 120.

In this way, the ADC circuit 100 may minimize the time and power required to calculate the correlation value for calibrating the sampling timing of the plurality of ADCs 120 while maintaining the accuracy of calibration with respect to the sampling timing of the plurality of ADCs 120.

According to an embodiment of the present disclosure, the ADC circuit may minimize the power and time required to calibrate the sampling timing of a plurality of ADCs.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An analog-to-digital converter (ADC) circuit, the ADC circuit comprising:

a plurality of ADCs configured to perform conversion operations in a time-interleaving manner; and a control logic circuit connected to the plurality of ADCs, wherein the control logic circuit is configured to:

calculate a correlation value between data output from the plurality of ADCs a first number of times using a first number of bits among each bit of the data;

calibrate a sampling timing of at least some of the plurality of ADCs, based on a first cumulative correlation value, which is obtained by accumulating correlation values calculated the first number of times;

calculate the correlation value between the data a second number of times by using a second number of bits in each of the data, wherein the second number of times is greater than the first number of times and the second number of bits is greater than the first number of bits; and calibrate the sampling timing of the at least some of the plurality of ADCs, based on a second cumulative correlation value, which is obtained by accumulating correlation values calculated the second number of times.

2. The ADC circuit of claim 1, wherein the control logic circuit is configured to:

increment a calibration count in response to calibrating the sampling timing of the at least some of the ADCs, based on the first cumulative correlation value; and calculate the correlation value between the data the second number of times using the second number of bits in each of the data, in response to the calibration count exceeding a first threshold number.

3. The ADC circuit of claim 1, further comprising:

a clock generation circuit configured to generate a reference clock signal; and a delay circuit configured to control a phase of the reference clock signal and to transmit a plurality of clock signals having different phases to each of the plurality of ADCs, and wherein the control logic circuit, through the delay circuit, controls the phase of at least some of the plurality of clock signals in a calibration direction based on a sign of the first cumulative correlation value to calibrate the sampling timing of the at least some of the plurality of ADCs.

4. The ADC circuit of claim 3, wherein the control logic circuit, through the delay circuit, calibrates the phase of the at least some of the plurality of clock signals in a calibration direction based on a sign of the second cumulative correlation value to calibrate the sampling timing of the at least some of the plurality of ADCs.

5. The ADC circuit of claim 3, wherein the control logic circuit, through the delay circuit, calibrates the phase of the at least some of the plurality of clock signals by a calibration amount based on an amount of the first cumulative correlation value to calibrate the sampling timing of the at least some of the plurality of ADCs.

6. The ADC circuit of claim 1, wherein the control logic circuit uses the first number of bits from a most significant bit (MSB) among each bit of the data to calculate the correlation value between the data the first number of times.

7. The ADC circuit of claim 1, wherein each of the plurality of ADCs performs a conversion operation on an analog input in the time-interleaving manner to output digital data including the second number of bits.

8. The ADC circuit of claim 2, wherein the control logic circuit is configured to:

increment the calibration count in response to calibrating the sampling timing of the at least some of the ADCs, based on the second cumulative correlation value; and calculate the correlation value between the data a third number of times using a third number of bits in each of the data, in response to the calibration count exceeding a second threshold number greater than the first threshold number, wherein the third number of times is greater than the second number of times and the third number of bits is greater than the second number of bits.

9. The ADC circuit of claim 8, wherein the control logic circuit calibrates the sampling timing of the at least some of the plurality of ADCs based on a third cumulative correlation value, which is obtained by accumulating correlation values calculated the third number of times.

10. The ADC circuit of claim 1, further comprising:

a multiplexer configured to output some of the data, and wherein the control logic circuit controls the multiplexer to sequentially output the data.

11. A method of controlling of an analog-to-digital converter (ADC) circuit, the method comprising:

calculating a correlation value between data output from a plurality of ADCs a first number of times using a first number of bits in each of the data;

calibrating a sampling timing of at least some of the plurality of ADCs, based on a first cumulative correlation value, which is obtained by accumulating correlation values calculated the first number of times;

calculating the correlation value between the data a second number of times using a second number of bits in the each of the data, wherein the second number of time is greater than the first number of times and the second number of bits is greater than the first number of bits; and calibrating the sampling timing of the at least some of the plurality of ADCs, based on a second cumulative correlation value, which is obtained by accumulating correlation values calculated the second number of times.

12. The method of claim 11, further comprising:

incrementing a calibration count in response to calibrating the sampling timing of the at least some of the ADCs based on the first cumulative correlation value; and calculating the correlation value between the data the second number of times using the second number of bits in each of the data, in response to the calibration count exceeding a first threshold number.

13. The method of claim 11, wherein the calibrating of the sampling timing of the at least some of the plurality ADCs, based on the first cumulative correlation value includes:

determining a calibration direction for the sampling timing of the at least some of the plurality of ADCs based on a sign of the first cumulative correlation value; and controlling a phase of the at least some of a plurality of clock signals input to the plurality of ADCs in the calibration direction.

14. The method of claim 13, wherein the calibrating of the sampling timing of the at least some of the plurality ADCs, based on the first cumulative correlation value includes:

determining a calibration amount for the sampling timing of the at least some of the plurality of ADCs based on an amount of the first cumulative correlation value; and controlling the phase of the at least some of the plurality of clock signals by the calibration amount.

15. The method of claim 11, wherein the calculating of the correlation value between the data using the first number of bits in each of the data includes calculating the correlation value between the data the first number of times by using the first number of bits from a most significant bit (MSB) among bits of the data.

16. An electronic device which transmits and receives a radio frequency (RF) signal, the electronic device comprising:

an antenna configured to receive the RF signal; and an analog-to-digital converter (ADC) circuit configured to convert the RF signal into a digital signal, wherein the ADC circuit includes:

a first ADC and a second ADC which perform conversion operations in a time-interleaving manner, and a control logic circuit connected to the first ADC and the second ADC, wherein the control logic circuit is configured to:

calculate a correlation value between first data output from the first ADC and second data output from the second ADC using a first number of bits in each of the first data and the second data;

calibrate a sampling timing of at least some of the first ADC and the second ADC, based on a first cumulative correlation value that includes the calculated correlation value;

calculate a correlation value between the first data and the second data using a second number of bits greater than the first number of bits in each of the first data and the second data; and calibrate the sampling timing of the at least some of the first ADC and the second ADC, based on a second cumulative correlation value that includes the calculated correlation value.

17. The electronic device of claim 16, wherein the control logic circuit is configured to:

increment a calibration count in response to calibrating the sampling timing of the at least some of the first ADC and the second ADC, based on the first cumulative correlation value; and calculate the correlation value between the first data and the second data using the second number of bits in each of the first data and the second data, in response to the calibration count exceeding a first threshold number.

18. The electronic device of claim 16, further comprising:

a clock generation circuit configured to generate a reference clock signal; and a delay circuit configured to control a phase of the reference clock signal and to transmit clock signals having different phases to each of the first ADC and the second ADC, and wherein the control logic circuit, through the delay circuit, controls the phase of at least some of the clock signals in a calibration direction based on a sign of the first cumulative correlation value to calibrate the sampling timing of the at least some of the first ADC and the second ADC.

19. The electronic device of claim 16, wherein the control logic circuit accumulates and calculates the correlation value between the first data and the second data a first number of times using the first number of bits in each of the first data and the second data, and wherein the first cumulative correlation value is obtained by accumulating a plurality of correlation values calculated the first number of times.

20. The electronic device of claim 19, wherein the control logic circuit accumulates and calculates the correlation value between the first data and the second data a second number of times greater than the first number of times using the second number of bits in each of the first data and the second data, and wherein the second cumulative correlation value is obtained by accumulating a plurality of correlation values calculated the second number of times.

\* \* \* \* \*